US012601776B2

(12) United States Patent
Sakata et al.

(10) Patent No.: US 12,601,776 B2
(45) Date of Patent: Apr. 14, 2026

(54) POWER-SEMICONDUCTOR-DEVICE TEST APPARATUS FACILITATING TEST-CONNECTION CHANGES

(71) Applicant: Qualtec Co., Ltd., Osaka-fu (JP)

(72) Inventors: Shigeo Sakata, Sakai (JP); Takahiro Kajinishi, Sakai (JP); Seiichiro Kihara, Sakai (JP); Hiroshi Takahara, Sakai (JP)

(73) Assignee: Qualtec Co., Ltd., Osaka-fu (JP)

( * ) Notice: Subject to any disclaimer, the term of this patent is extended or adjusted under 35 U.S.C. 154(b) by 144 days.

(21) Appl. No.: 18/673,827

(22) Filed: May 24, 2024

(65) Prior Publication Data

US 2024/0310426 A1      Sep. 19, 2024

Related U.S. Application Data

(63) Continuation of application No. 17/616,673, filed as application No. PCT/JP2020/020629 on May 25, 2020, now Pat. No. 11,994,551.

(30) Foreign Application Priority Data

Jun. 4, 2019   (JP) ................................. 2019-104417
Jun. 14, 2019   (JP) ................................. 2019-110761

(Continued)

(51) Int. Cl.
*G01R 31/26*         (2020.01)
*H02M 1/08*         (2006.01)

(52) U.S. Cl.
CPC ...... *G01R 31/2601* (2013.01); *G01R 31/2608* (2013.01); *H02M 1/08* (2013.01)

(58) Field of Classification Search
CPC .... G01R 31/00; G01R 31/26; G01R 31/2601; G01R 31/2607; G01R 31/2608;

(Continued)

(56) References Cited

U.S. PATENT DOCUMENTS 5,646,541 A    7/1997  Ninomiya
6,867,578 B1   3/2005  Miller
(Continued)

FOREIGN PATENT DOCUMENTS

CN        2837859 Y    11/2006
CN       103913695 A    7/2014
(Continued)

OTHER PUBLICATIONS

Tyco Electronics, "Pluggable Bus Bar Connectors," Power Connectors & Interconnection Systems, Bus Bar Products, downloaded Nov. 12, 2021, www. tycoelectronics. com, pp. 7-9, Catalog 1773096.
(Continued)

*Primary Examiner* — Hoai-An D. Nguyen
(74) *Attorney, Agent, or Firm* — j-pat U.S. Patent Legal Services; James W. Judge

(57)                ABSTRACT

Power semiconductor-device test apparatuses carrying out gate-signal controlled on/off switching of high-amp test current for various forms of device lifespan testing. Fork plugs or like connectors are insertable through openings of choice in walls partitioning the test apparatus interior for connection, in lieu of altering of wire-line changes, to switch circuits of choice, facilitating test-type connection changing. Sample-connection circuits, removable by means of connectors, include gate-driver, variable-resistor, constant-current, and voltage-output circuits, and via the gate driver circuits generate gate signals, adjustable via the variable-resistor circuits, shorting-circuit on/off applied to the gate terminals of devices under test. The constant-current circuit feeds a diode across the non-gate terminals of a device under test. A control circuit varies current, gate, and output voltages to set the test conditions so that device-under-test temperature will be a predetermined value.

30 Claims, 27 Drawing Sheets

(30) Foreign Application Priority Data

Jul. 5, 2019 (JP) ................................. 2019-125857
Aug. 7, 2019 (JP) ................................. 2019-144994

(58) Field of Classification Search

CPC ........... H02M 1/00; H02M 1/08; Y02B 70/00; Y02B 70/10

USPC .................................. 324/500, 537, 762.01

See application file for complete search history.

(56) References Cited

U.S. PATENT DOCUMENTS

| | | | | |
|---|---|---|---|---|
| 2005/0045919 A1* | 3/2005 | Kaeriyama | ......... | G11C 11/5614 |
| | | | | 257/E27.098 |
| 2013/0293249 A1 | 11/2013 | Han et al. | | |
| 2017/0003337 A1* | 1/2017 | Bito | ..................... | H10D 89/611 |
| 2021/0116515 A1* | 4/2021 | Xu | ......................... | G01R 31/52 |

FOREIGN PATENT DOCUMENTS

| | | | |
|---|---|---|---|
| CN | 107390147 A | 11/2017 |
| CN | 107991597 | 5/2018 |
| CN | 108919085 | 11/2018 |
| CN | 212275891 U | 1/2021 |
| CN | 1378088 A | 11/2022 |
| JP | H03-099438 U | 10/1991 |
| JP | H05-3234 | 1/1993 |
| JP | H06-025775 U | 4/1994 |
| JP | H06-281693 | 10/1994 |
| JP | 07-072193 A | 3/1995 |
| JP | H07-212207 | 8/1995 |
| JP | H08-086831 A | 4/1996 |
| JP | H11-186689 | 7/1999 |
| JP | 2003-143833 | 5/2003 |
| JP | 2007-258378 | 10/2007 |
| JP | 2009-168471 | 7/2009 |
| JP | 2014-138488 | 7/2014 |
| JP | 2014-531752 | 11/2014 |
| JP | 2014-232062 | 12/2014 |
| JP | 2015-126342 | 7/2015 |
| JP | 2017-017822 A | 1/2017 |
| JP | 2019-009377 | 1/2019 |
| JP | 7356088 B2 | 10/2023 |
| KR | 102581763 B1 | 9/2023 |
| WO | WO 2015/190087 A1 | 12/2015 |
| WO | WO 2016-035388 | 3/2016 |

OTHER PUBLICATIONS

Molex Datasheet, PowerPlane Busbar Power Connectors, downloaded Nov. 12, 2021, www.molex.com/link/busbar.html, Order No. 987651-6712.

TE Connectivity, "In-Line Mount 500A Busbar Conn. , " downloaded Nov. 12, 2021, www. te. com/usa-en/product-2204273-2. html, 2204273-2.

Hirose Electric Co., Ltd., "High Current Connector for Busbar Applications, " PS4 Series, Dec. 1, 2018, www.hirose-connectors. com, Yokohama, Japan.

Stäaubli, "Plug-In Systems," Main Catalog (2019), pp. 24-37, www. staubli. com.

* cited by examiner

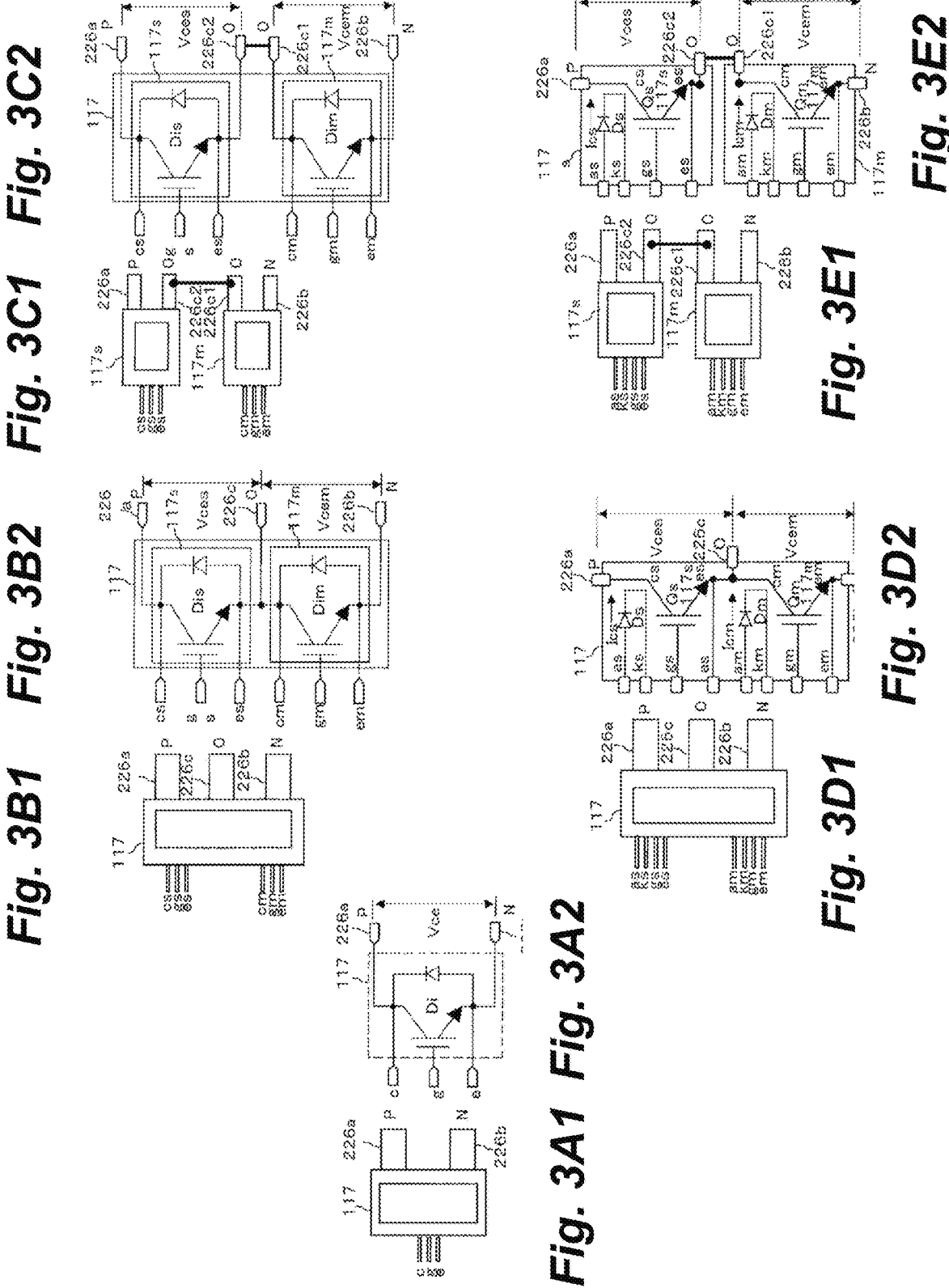
Fig. 3C2   Fig. 3C1   Fig. 3B2   Fig. 3B1
Fig. 3A1 Fig. 3A2
Fig. 3E2   Fig. 3E1   Fig. 3D2   Fig. 3D1

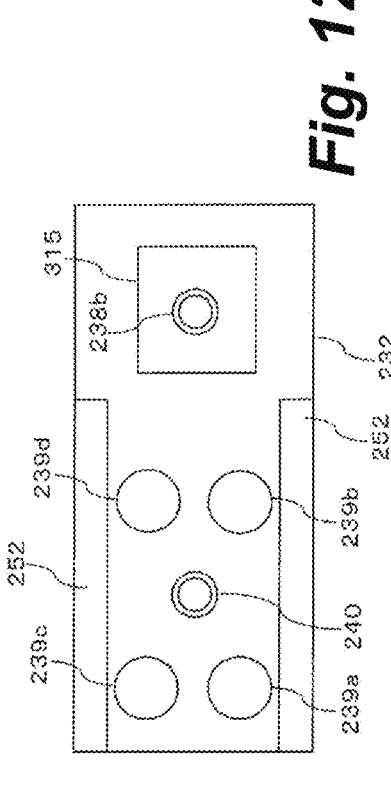
*Fig. 12B*
*Fig. 12D*
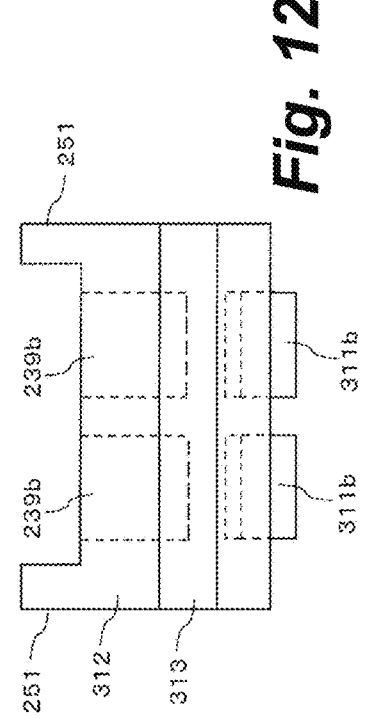
*Fig. 12A*
*Fig. 12C*

POWER-SEMICONDUCTOR-DEVICE TEST APPARATUS FACILITATING TEST-CONNECTION CHANGES

CROSS-REFERENCE TO RELATED APPLICATIONS

This is a continuation application of application Ser. No. 17/616,673, filed Dec. 5, 2021. Application Ser. No. 17/616, 673 was the U.S. National Stage of International Application No. PCT/JP2020/020629, with a 35 U.S.C. 371(c) date of May 25, 2020.

BACKGROUND OF THE INVENTION

Technical Field

The present invention relates to electrical-component test devices, and methods of testing electrical components, with which testing of semiconductor components and electrical components is carried out.

Description of Related Art

For lifespan testing of electrical components including semiconductor components, electrical current passing through the components is switched on/off. The current applied to power semiconductor components especially is a large several hundred amperes. There are numerous types of electrical-component tests, wherein changing connection of the connection lines to correspond to the type of test is necessary.

For lifespan testing of electrical components including semiconductor components, electrical current passing through the components is switched on/off. The current applied to power semiconductor components especially is a large several hundred amperes. There are numerous types of electrical-component tests—an example of which is the power-cycle testing described in Japanese Unexamined Pat. App. Pub. No. 2017-17822—wherein changing connection of the connection lines to correspond to the type of test is necessary.

The fact that the constant current that is applied in order to test transistors and like semiconductor components is several hundred A or more makes employing thick, low-resistance wire stock for the connection lines necessary. Thick connection lines are stiff and lack flexibility. Changing connection of connection lines that are of thick wire stock when the lines are matched to a testing provision requires considerable time.

SUMMARY OF THE INVENTION

The present claims involve test apparatuses that are for testing semiconductor devices having first, second and gate connections, and that are furnished with a test-current/voltage supplying power-supply circuit, a switch-circuit board(s) carrying a switch circuit, a voltage output circuit (op amp/buffer amp) functioning to output selected voltages across the first and second connections of the semiconductor device under test, and a gate driver circuit functioning to apply to the gate connection of the semiconductor device under test a select periodic signal voltage that puts the semiconductor device under test into an off state. The switch circuit(s) functions to switch on/off the supplying of current to a device under test output by the power-supply circuit.

The switch-circuit board(s) may have conductor plates or rods connected to corresponding terminals of the switch circuit, and to which a semiconductor device under test connects, wherein the switch circuits may be operated to short-circuit the conductor plates or rods and thereby supply test current/voltage from the power-supply circuit to the device under test. Further, semiconductor-device test apparatuses of the present claims may be provided with plural switch circuits connecting to plural gate connections.

Semiconductor-device test apparatuses that the present claims involve may further be furnished with a diode arranged to connect with the first and second connections of a semiconductor device under test, and further include a constant-current circuit for feeding a constant current to the diode. Therein, the voltage output circuit outputs the voltage across the terminals of the diode fed the constant current.

The voltage output from the voltage output circuit may be converted into temperature information on the semiconductor device under test, with the voltage therein being controlled based on the temperature information.

In some embodiments, the inter-terminal diode voltage may be monitored to measure or otherwise observe temperature change in the semiconductor device under test.

In semiconductor-device test apparatuses that the present claims involve, the switch circuits may be MOSFETs, with the MOSFETs being controlled synchronized to the signal voltage output by the gate driver circuit.

Semiconductor-device test apparatuses that the present claims involve may be further furnished with a heating/cooling plate arranged for making tight contact with a semiconductor device under test, with a water-leak sensor disposed along the periphery of the heating/cooling plate, wherein the semiconductor-device test apparatuses are configured to halt or sound an alarm if the water-leak sensor is triggered.

Semiconductor-device test apparatuses that the present claims involve may be furnished with a resistor circuit connected to the output end of the gate driver circuit and arranged to connect with the gate connection of a semiconductor device under test, wherein the voltage across the resistor circuit may be measured. In some embodiments, the resistance of the resistor circuit may be variable for adjusting or setting the rising and falling waveforms of the gate signal from the gate driver circuit.

The interior of semiconductor component test apparatuses of the present claims may be partitioned by a partitioning wall(s) into a space(s) for receiving a semiconductor device(s) under test, and a placement zone(s) for the switch-circuit board(s), with the partitioning wall(s) being provided with openings, corresponding to position(s) of the switch-circuit board(s), through which one of the terminals of a semiconductor device under test may be connected to a switch circuit.

Making and changing of connections between the switch-circuit board(s) and a device(s) under test may be carried out by inserting a connector, which may be a fork plug, through an opening in the partitioning wall to bring the connector and one of the conductor plates or rods on the switch-circuit board(s) into electrical contact.

A semiconductor-device test apparatus of the present claims may be configured such that the potential of a given first signal voltage from the gate driver circuit is floating with respect to the potential of a given second signal voltage from the gate driver circuit, so as to render the signal potentials insusceptible to noise generated by the power-supply circuit, the switch circuit(s), and a semiconductor device under test during the repeated on/off operations executed by the test apparatus.

Semiconductor-device test apparatuses that the present claims involve may be housed in a cabinet sectioned into divisions in some of which the switch-circuit boards are disposed, and in others of which semiconductor devices under test are accommodated, wherein the semiconductor-device test apparatuses are enabled for injecting dry air into the divisions accommodating the devices under test.

BRIEF DESCRIPTION OF DRAWINGS

FIGS. 3A1 and 3A2, 3B1 and 3B2, 3C1 and 3C2, 3D1 and 3D2, and 3E1 and 3E2 are respective pairs of explanatory diagrams and equivalent-circuit diagrams of a semiconductor component being tested.

FIGS. 4A and 4B are a block diagram and explanatory diagram of a semiconductor-component test device of the present invention.

FIG. 12A through 12D are explanatory and configurational diagrams of a semiconductor-component mounting section of the present invention.

DETAILED DESCRIPTION OF THE INVENTION

In the following, an explanation of a test device and testing method for electrical components according to a mode of embodying the present invention will be made, with reference to attached drawings. In the embodying modes described by the specification, among power semiconductor components as electrical components, chiefly IGBTs will be described as an example.

The present invention is not limited to IGBTs, but can be applied to various semiconductor components such as SiC transistors, MOSFETS, JFETs, thyristors, diodes, thermistors, and posistors.

Moreover, the present invention is not limited to semiconductor components, but it goes without saying that the present invention can be applied to electrical components other than semiconductor components, such as resistance elements, capacitors, coils, crystal elements, and ZNRs. As to embodiments of the present invention, single parts or the entireties of the respective examples can be combined, and can be modified and combined.

Figure 2A:
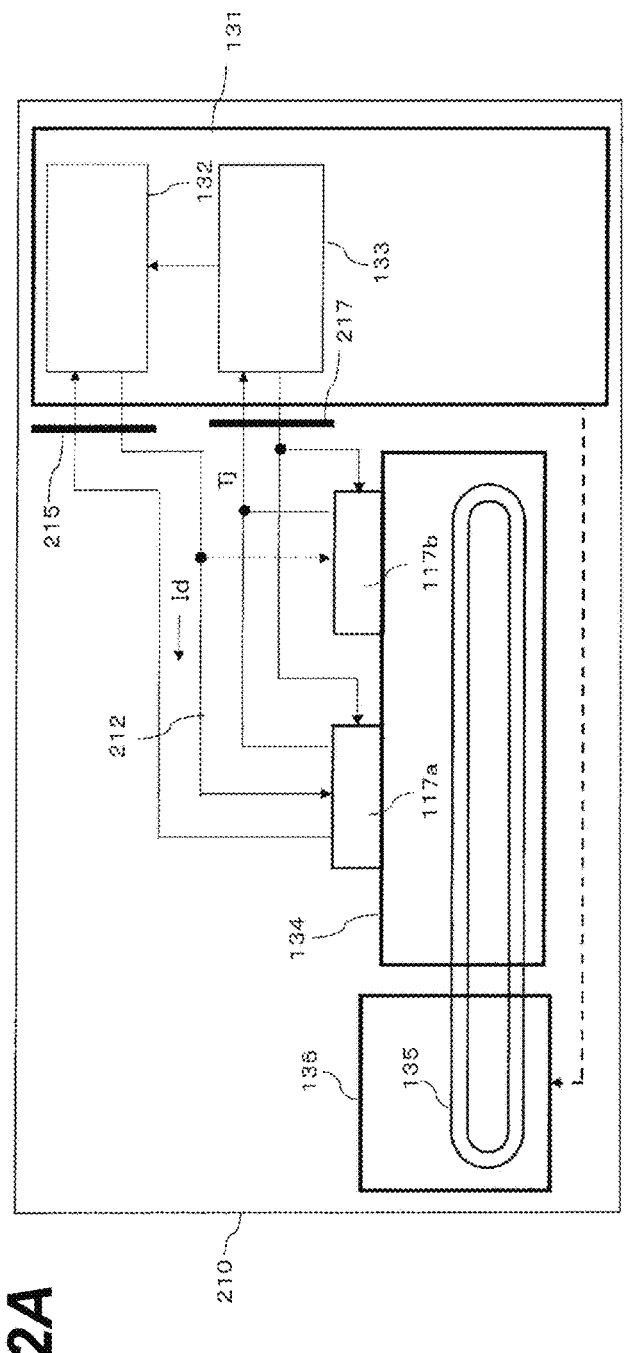
FIGS. 2A and 2B are configurational diagrams of a semiconductor-component test device of the present invention.

FIG. 2 is a configurational diagram and an explanatory diagram of a semiconductor-component test device of the present invention. As illustrated in FIG. 2A, a semiconductor-component test device of the present invention has a cabinet 210, a chiller (cooling/heating device) 136, a heating/cooling plate 134, and a circulating water pipe 135 for circulation between the heating/cooling plate 134 and the chiller 136. On the heating/cooling plate 134, a transistor 117 or the like being tested is placed in tight contact with the heating/cooling plate 134.

Figure 2B:
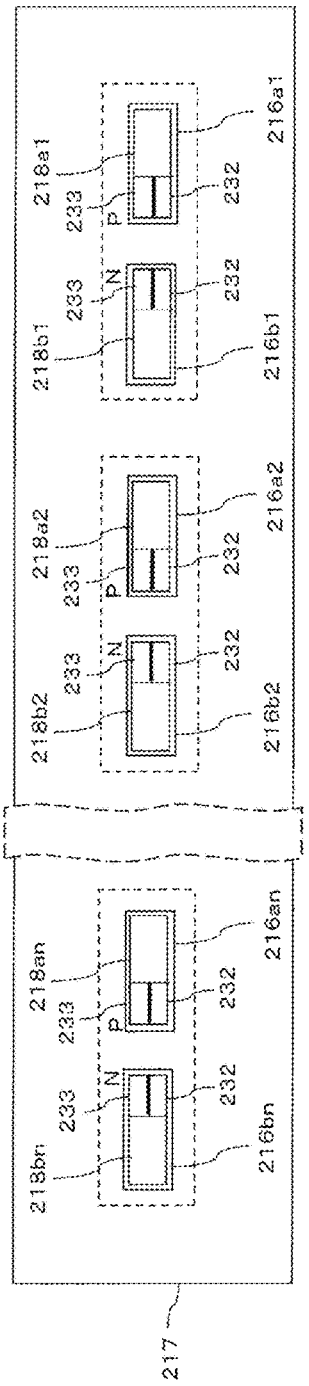

As illustrated in FIG. 2B, a partitioning wall 217 is provided with an opening 216 into which a connecting structure 218, illustrated by FIGS. 7A and 7B, FIG. 9, FIG. 11A through 11D and elsewhere, is inserted. A partitioning wall 215 is provided with a hole into which a power-supply line 212 is inserted.

A control rack 131 has a power supply 132 that supplies a test current and a test voltage to the semiconductor component 117, and a control circuit 133 that controls the semiconductor component 117 or the like, as well as sets test conditions.

The control circuit 133 changes a current Id, a gate voltage Vg, and a voltage Vce to set the test conditions so that information Tj on the semiconductor component 117 temperature will be a predetermined value, and carries out testing. The control circuit 133 controls the power supply 132, and the power supply 132 supplies a test voltage or current to the semiconductor component 117 being tested.

When the temperature information Tj changes or changes to the predetermined value, it is determined that the semiconductor component 117 has either deteriorated or its properties have changed, and either the testing of the semiconductor component 117 is stopped, or the testing method and control method are changed.

By heating or cooling the circulating water in the chiller 136, the temperature of the semiconductor component 117 is maintained at a prescribed value or a predetermined value. Also, the temperature of the semiconductor component or the like is periodically changed in correspondence with the test conditions, or else the component is cooled or heated to be a steady temperature.

Figure 1:
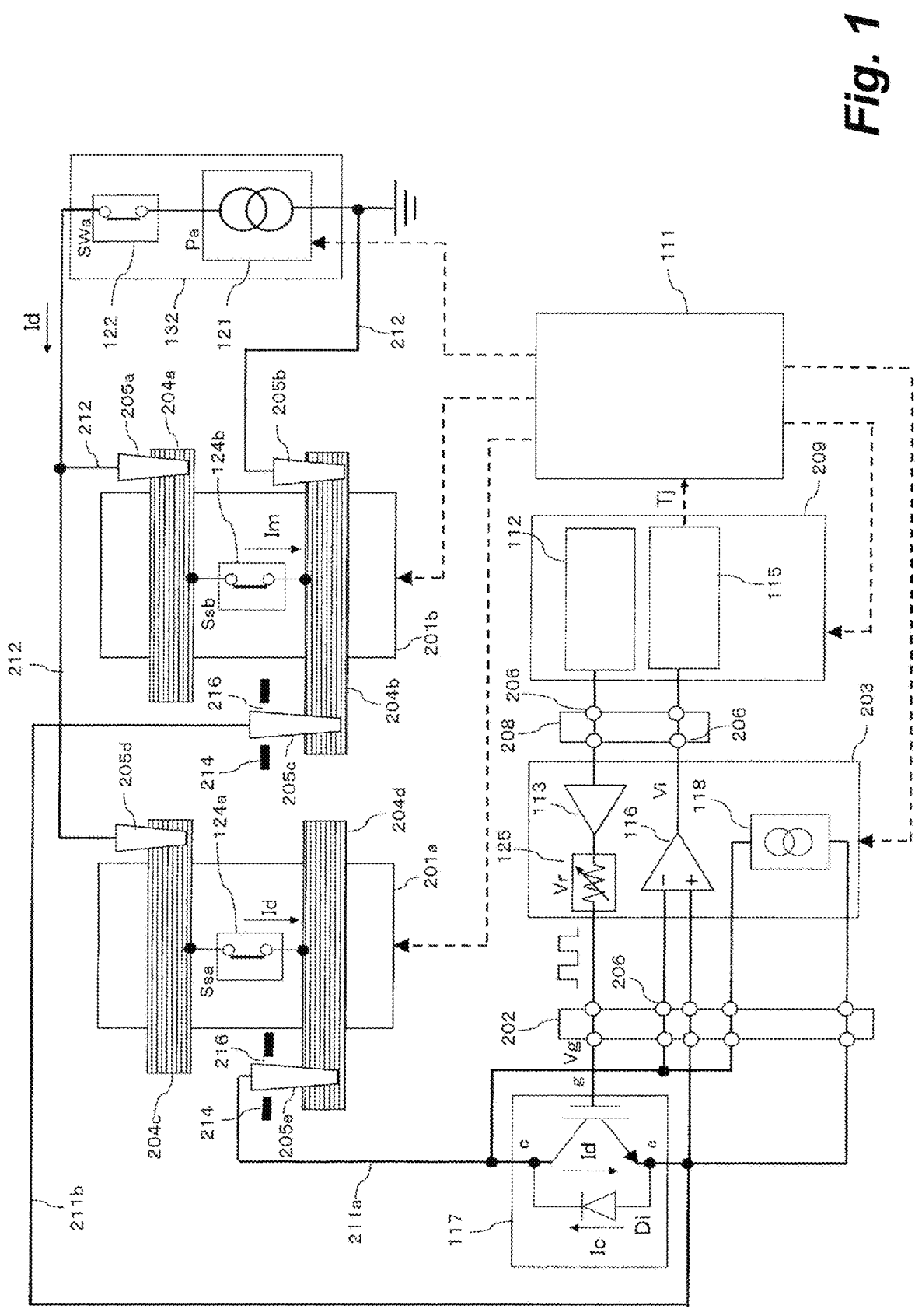
FIG. 1 is a block diagram and explanatory diagram of a semiconductor-component test device of the present invention.

The semiconductor-component test device and the semiconductor component testing method of the present invention are applicable to a diverse variety of semiconductor components 117 and semiconductor modules 117 such as those illustrated in FIG. 3A through 3J. The semiconductor component 117 or the like in FIG. 3A through 3J has terminals that a large current is applied to or output from: a P electrode terminal, an O electrode terminal, and an N electrode terminal. FIG. 3A1 through 3E2 are outline diagrams and equivalent-circuit diagrams of the semiconductor component. FIGS. 3A1 and 3A2 are configurations having one transistor 117 and one diode Di.

FIGS. 3B1 and 3B2 are configurations having transistors 117 (transistor 117m, transistor 117s) and diodes Di (diode Dim, diode Dis).

FIGS. 3C1 and 3C2 are configurations for linking, and carrying out a test on, a plurality of transistors by connecting terminals of semiconductor components including a transistor 117 (transistor 117m or transistor 117s) and a diode Di (diode Dim or diode Dis).

FIGS. 3D1 and 3D2 are configurations having a transistor 117 (transistor 117m, transistor 117s), and a diode D (diode Ds, diode Dm) possessing a terminal independent of the transistor terminals.

FIGS. 3E1 and 3E2 are configurations for linking, and performing a test on, a plurality of transistors by connecting a transistor 117 (transistor 117m or transistor 117s) and the terminal of a semiconductor component having a diode D (diode Dm or diode Ds) possessing a terminal independent of the transistor terminals. In the following embodiments, an explanation chiefly exemplifying the semiconductor component 117 illustrated in FIG. 3A2 to 3E2 will be made. FIG. 1 is a block diagram and explanatory diagram of a semiconductor-component test device of the present invention.

The power supply 132 outputs a large constant current for testing the transistor 117. The power supply 132 supplies electric power (current, voltage) in synchronization with a control signal from a control circuit board (controller) 111. With the power supply 132, the setting for a maximum voltage that it outputs can be made. A switch circuit 122 (SWa) functions to switch on (supply, apply) and switch off (cut off, open-circuit) the supplying of constant current output by the power supply 132. In the semiconductor-component test device of the present invention, the number of power supplies 132 is not limited to one. The device may be made to hold two or more power supplies 132.

In the embodiment of the present invention, a fork plug will be described as an example of connection plugs 205. As with fork plug 205e connected to the collector terminal of the transistor 117 and fork plug 205d connected to one of the terminals on the power supply 132, the fork plugs 205 are connected to one end of respective connection lines 211 and respective power-source lines 212, connecting the fork plugs to conductor plates 204.

It should be noted that although in the present specification and drawings they will be described as conductor plates 204, they are not limited to plates; they may be virgate articles. They may be constituted from a plurality of structures. They may take any shape or form as long as it can be joined to the fork plugs 205 or like structures. They may be, for example, structures such as sockets or connectors. Moreover, the conductor plates 204 may be rendered in the form of a fork plug-like form, and said fork plugs may be connected to the fork plugs 205.

As long as a fork plug 205 or the like is formed or placed on at least one terminal of the transistor 117 being tested, and the fork plug 205 and the conductor plate 204 or like connection target are electrically connected, the present invention may assume any configuration.

The fork plug 205 will be described with the fork plug 205 being inserted into a constituent or a structure, such as a partitioning wall 214, that separates spaces. However, it is not limited to this case. For example, a fork plug 205c may be connected to a conductor plate 204b, inserted through the partitioning wall 214, and electrically connected to one terminal (emitter terminal e) of the transistor 117.

The partitioning wall 214, the partitioning wall 215, and the partitioning wall 217 of the semiconductor-component test device of the present invention may be of any configuration that segments or splits a space or an area. A diverse variety of configurations or structures including mural forms, sheet forms, mesh-like forms, film-like forms, and foil-like forms are applicable.

The fork plug 205 may be of any configuration, structure, geometry, form, or method whereby it can be electrically connected to a conductor plate 204 or like object of interest by press fitting, pressure welding, insertion, crimping, clasping, interlocking, or the like.

The test current Id flowing to the transistor 117 is supplied by the power supply 132 being operated. The power supply 132 is activate/deactivate-(on/off)-controlled by means of a signal from the control circuit board (controller) 111. Also, output and non-output of the current Id are switched between. The device-control circuit board 209 is controlled by the control circuit board (controller) 111.

In FIG. 1, the transistor 117 on which testing is carried out (i.e., a semiconductor device under test) will be described exemplifying the one having the diode Di illustrated in FIG. 3A. The emitter terminal e of the transistor 117 will be described as being grounded. Connected to the gate terminal g of the transistor 117 is a gate driver circuit 113.

In a sample connection circuit 203, the gate driver circuit 113, a variable resistor circuit 125, a constant-current circuit 118, and an op amp (buffer circuit) 116 operating as a voltage output circuit are either disposed or formed.

The sample connection circuit 203 is separated from, and electrically connected by a connector 208 to, the device control circuit board 209 so that it may be disposed in a position close to the transistor 117 on which testing is carried out.

The sample connection circuit 203 is connected to the transistor 117 by connection pins 206 of a connector 202. The interval between the gate driver circuit 113 and the gate terminal g of the transistor 117 is arranged so as to be a short separation of 30 mm or less. If the interval between the gate driver circuit 113 and the gate terminal g of the transistor 117 is long, noise or the like will be superimposed on the gate terminal g, and due to the noise, the transistor 117 will malfunction.

As illustrated in FIG. 1, a test signal is applied from the gate driver circuit 113 to the gate terminal g of the transistor 117. The gate driver circuit 113 has an op amp circuit.

Figure 5:
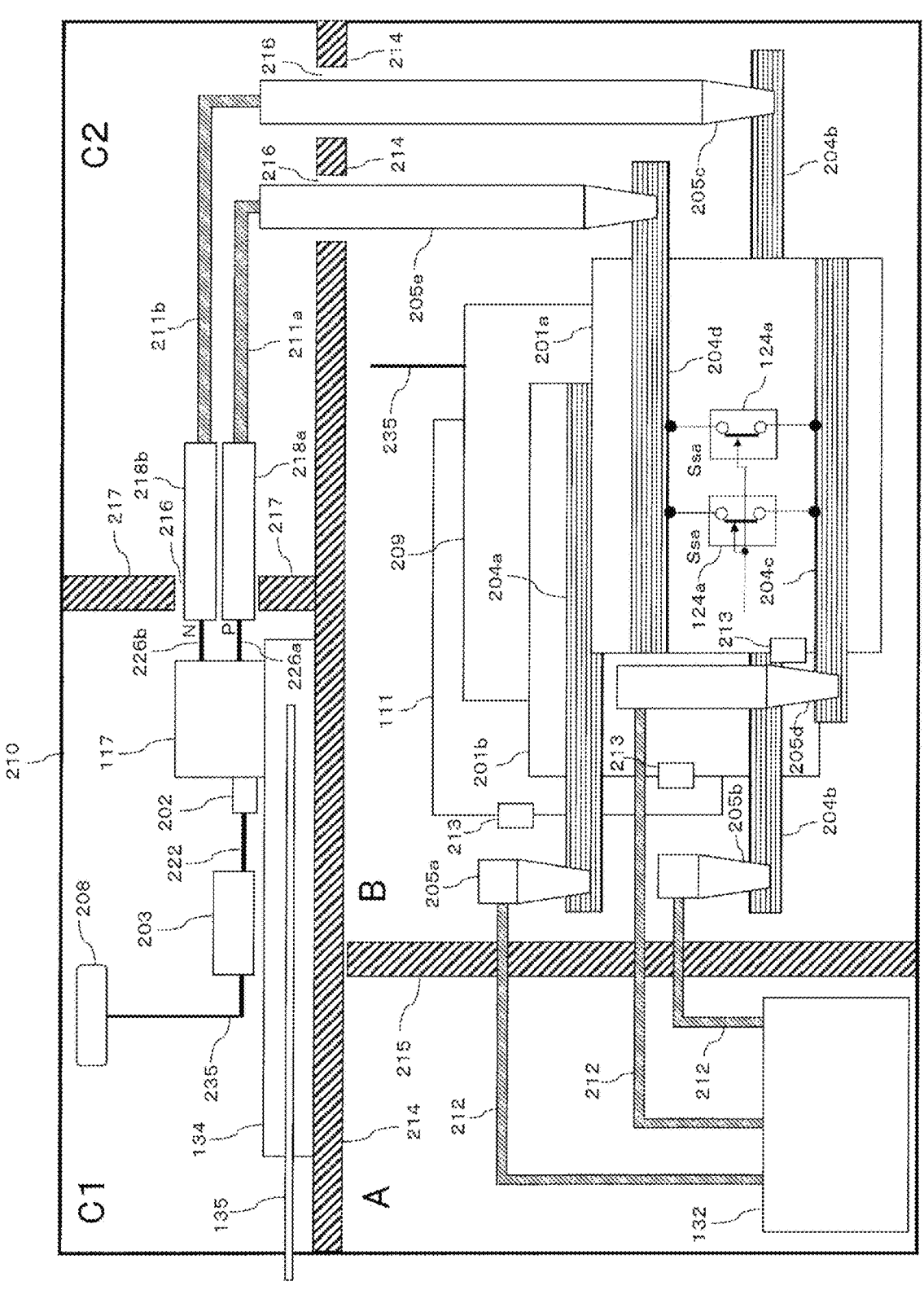
FIG. 5 is an explanatory and configurational diagram of a semiconductor-component test device of the present invention.

As illustrated in FIG. 5, the device-control circuit board 209 is placed in a B chamber of the cabinet 210 of the semiconductor-component test device. Incorporated into the cabinet 210 are, inter alia, a power supply 132, a drive circuit system, and a heating/cooling plate 134.

In order to dispose the sample connection circuit 203 in a position close to the transistor 117 on which testing is carried out, it is placed in a C1 chamber in the cabinet 210 of the semiconductor-component test device. The sample connection circuit 203 is connected to the connector 208, which is disposed on a lateral face of the cabinet 210. The connection lines connected to the connection pins 206 of the connector 208 are connected to the device-control circuit board 209 in the B chamber.

The sample connection circuit 203 is connected to the device-control circuit board 209 by the connection pins 206 of the connector 208. Sample connection circuits 203 are individually arranged corresponding to each transistor 117 on which testing is carried out, and the sample connection circuits 203 are configured so as to be easily removable by means of the connectors 202 and the like.

The constant-current circuit 118 supplies a constant current Ic to the diode Di disposed or formed in the channel of the transistor 117. The op amp circuit 116 buffers the terminal voltage across (lowers the output impedance of) the diode Di and outputs it as a Vi voltage. The Vi voltage is analog-to-digital-converted by a temperature measuring circuit 115.

The temperature measuring circuit 115 finds, from the terminal voltage Vi, temperature information Tj on the transistor 117, and transfers it to the control circuit board 111. The temperature information is output from a connector 213 on the device-control circuit board 209 to a motherboard 207 and sent to the control circuit board 111.

Figures 27A, 27B:
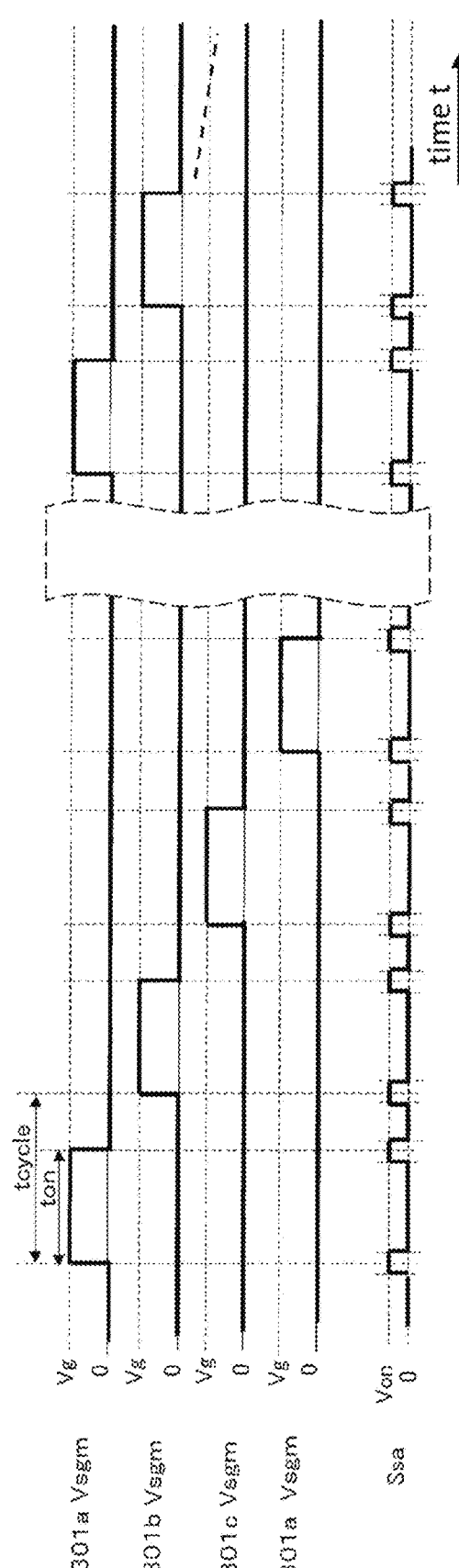
FIGS. 27A and 27B are respectively a block diagram of, and a timing-chart diagram for, a semiconductor-component test device of the present invention.

The gate driver circuit 113 applies a set frequency (on/off cycle), set ON voltage to the gate terminal of the transistor 117. As an example, as illustrated in FIG. 27B, the on/off period of the transistor 117 is $t_{cycle}$, and the ON time is $t_{on}$.

By means of a Vg signal voltage output from the gate driver circuit 113, the transistor 117 activate/deactivate (on/off) operates, and during the period the transistor 117 is on, the current Id flows along the channel of the transistor 117.

The gate driver circuit 113 has the variable resistor circuit 125. The variable resistor circuit 125 resistance Vr, with its value being between $0\Omega$ and $500\Omega$, is configured to render the voltage constant, or timewise-variant.

The gate driver circuit 113 can set the rising-waveform slope (rising time Tr) and a falling-waveform slope (falling time Td) of the gate electrical signal applied to the gate terminal g of the transistor 117.

The resistance value Vr of the variable resistor circuit 125 of the gate driver circuit 113 in FIG. 1 and elsewhere is rendered variable, but is not limited to being so. For example, the variable resistor circuit 125 may be rendered an external resistor.

The constant-current circuit 118 causes a predetermined constant current Ic to flow. The constant current Ic is applied to the diode Di. By monitoring the voltage across the diode Di terminals, temperature change in the transistor 117 can be measured or observed.

In order to prevent generation of heat in the transistor 117 at the constant current Ic, the constant current Ic is set to a current value sufficiently smaller than the constant current Id flowing in the channel of the transistor 117.

Specifically, the constant current Ic is set to $\frac{1}{1000}$ or less of the current Id flowing through the transistor 117 during testing. Preferably, the current Ic flowing through the transistor 117 is set to 1 or more part in $1\times10^{6}$ and 1 or less part in $1\times10^{4}$ of the current Id. The constant current Ic is set to 0.1 mA or greater and 100 mA or less.

A channel current Id is changed and a diode Di voltage (voltage across the collector and emitter terminals of the transistor 117) is measured to find a temperature coefficient K. The acquired temperature coefficient K is stored in the temperature measuring circuit 115.

For the temperature coefficient K, the transistor 117 is put at a predetermined temperature with the heating/cooling plate 134, the constant current Ic is made to flow in the diode Di, and the terminal voltage is measured. By changing the predetermined temperature and measuring the voltage across the diode Di terminals, the diode Di terminal voltage with respect to the transistor 117 temperature can be acquired. Thus, the temperature coefficient K of the transistor 117 can be found from the diode Di terminal voltage with respect to the temperature.

The constant current Ic flows in the diode Di when the channel current Id is not flowing. That is, when the transistor 117 is not on, the constant current Ic is caused to flow to measure the voltage across the terminals of the diode Di. The op amp circuit (buffer circuit) 116 outputs the terminal voltage Vi (terminal c-terminal e) across the diode Di.

The op amp circuit 116 is not limited to those constituted by op amp components. It may be of any configuration provided that the output impedance is lower than the input impedance.

The acquired temperature information Tj is sent to the control circuit board (controller) 111. If the temperature information Tj is at or above a predetermined set value, the control circuit board (controller) 111 determines that the transistor 117 has gone into a predetermined stress state or deteriorated state, and changes the test control or stops the test.

In the embodiments illustrated in FIG. 1 and elsewhere, for the switch circuit Ssa 124a and the switch circuit Ssb 124b a switch-circuit symbol is used. Examples of the switch circuits 124 include a transistor, a mechanical relay, a phototransistor, a photodiode switch, and a PhotoMOS relay.

Figures 4A, 4B:
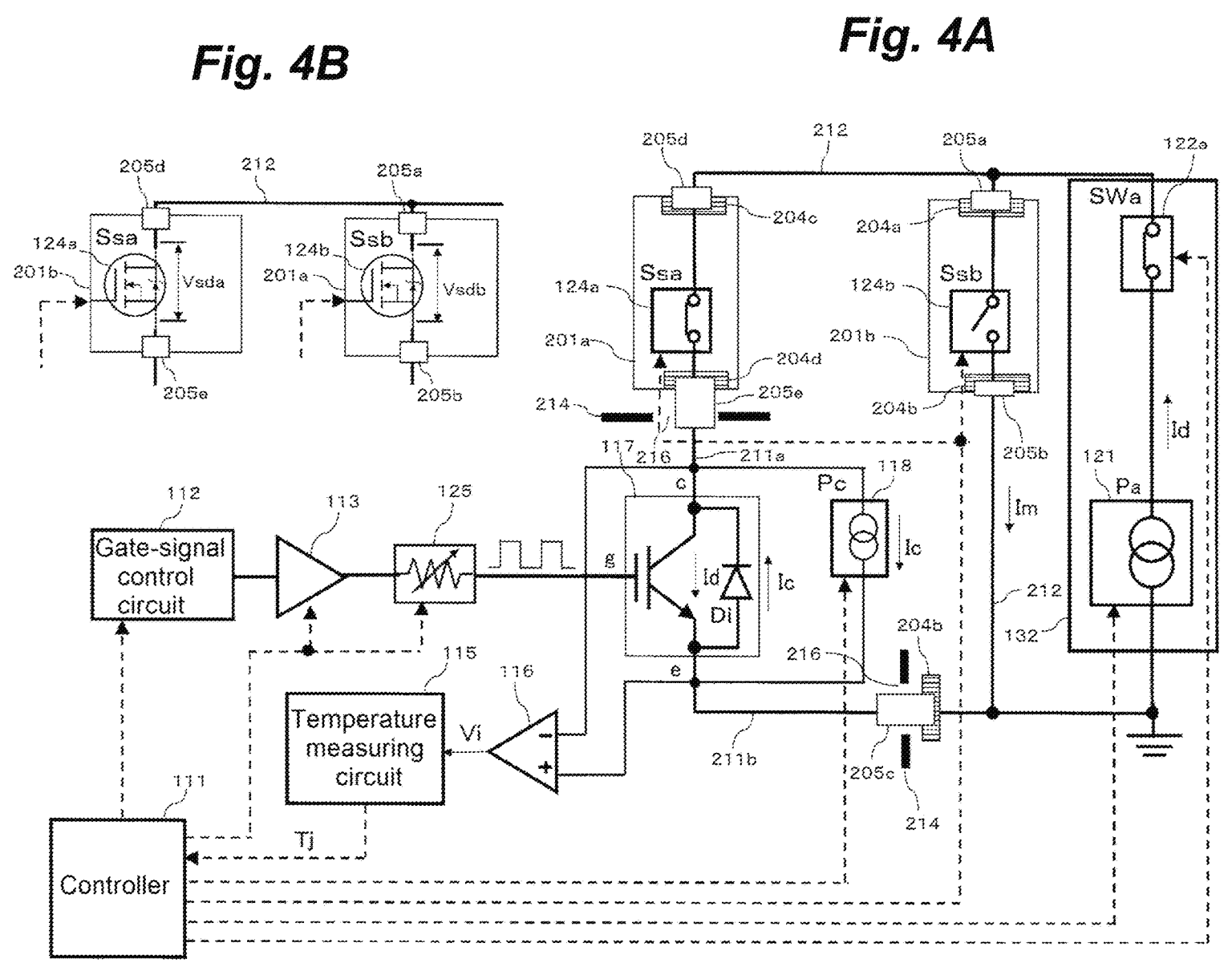

FIGS. 4A and 4B are an equivalent-circuit diagram and an explanatory diagram of a semiconductor-component test device according to a first embodiment of the present invention. In this embodiment, the switch circuits including switch circuit Ssa 124a and switch circuit Ssb 124b employ, as illustrated in FIG. 4B, a power MOSFET 124. MOSFETs are preferable because the voltage (Vsd) across the channel is small.

An on-state channel voltage (Vsdb) for the power MOSFET 124b is selected that is less than or equal to the on-state channel voltage (Vsda) of the power MOSFET 124a. That is, the on-state channel voltage (Vsdb) of the power MOSFET 124b is made smaller than the on-state channel voltage (Vsda) of the power MOSFET 124a. This is in order that the current Im flows stably when the switch circuit 124b is on and the terminals of the power supply 132 are short-circuited.

The switch circuits 124 are surface-mounted or formed on switch-circuit boards 201. The switch circuits 124 are connected to the conductor plates 204. The conductor plate 204 is, as one example, a plate made of copper of 5 mm thickness and 50 mm width. The length of the conductor plate 204 is, as one example, 250 mm. FIG. 5 and FIG. 13A through 13C illustrate the fork plugs 205 and connection (contact) states of the fork plugs 205 with the conductor plates 204.

Figures 13A, 13B, 13C:
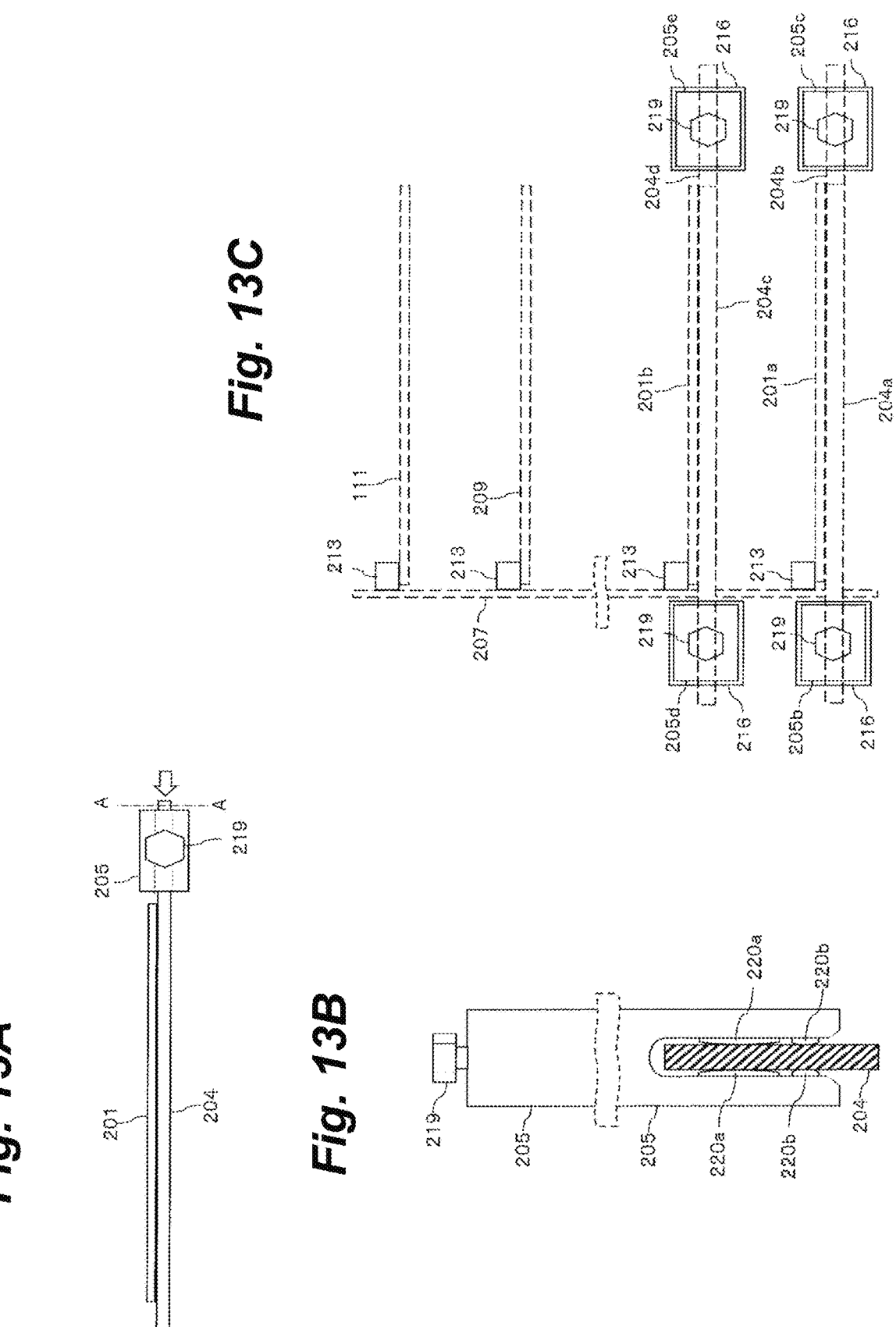
FIG. 13A through 13C are explanatory diagrams of an electrical connection unit of a semiconductor-component test device of the present invention.

FIG. 13A is a view schematically illustrating from above a state in which a conductor plate 204 is attached to a switch circuit board (printed circuit board) 201 on which a switch circuit or the like is formed, and in which a fork plug 205 is connected to the conductor plate 204. FIG. 13B is an explanatory diagram of a state in which the fork plug 205 is clasping one end of the conductor plate 204. As illustrated in FIG. 1, two conductor plates 204 are mounted on the switch circuit boards 201. The conductor plates 204 and the switch circuit boards 201 are screwed together.

By being mechanically fitted together, the fork plugs 205 and the conductor plates 204 realize an electrical connection. When into the U-portion of the fork plug 205 the conductor plate 204 has been socketed, the fork plug 205 and the conductor plate 204 are favorably joined together. As illustrated in FIG. 13A through 13C, a connection bolt 219 is attached to the fork plugs 205. The connection lines 211 are connected to the connection bolts 219.

FIG. 13B illustrates a cross section along AA' in FIG. 13A. The conductor plate 204 and the fork plug 205 contact each other on contact parts 220a and contact parts 220b formed on the fork plug 205. The contact parts 220 are composed of phosphor bronze and nickel alloy and have springiness. The surface of the contact parts 220 is gold-plated or silver-plated. Plating improves the electrical stability of these connection units 220.

Figure 6:
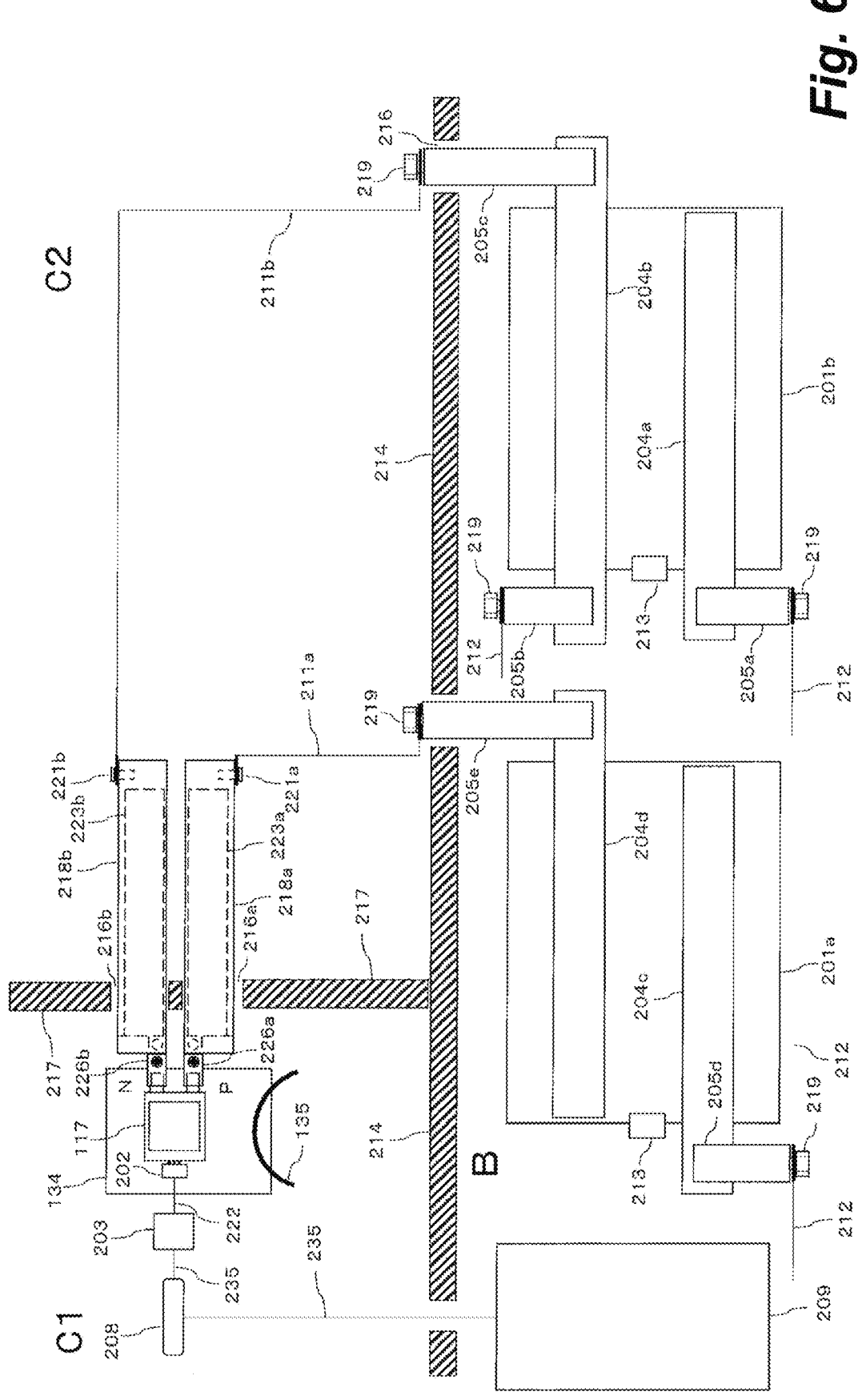
FIG. 6 is an explanatory and configurational diagram of a semiconductor-component test device of the present invention.

As illustrated in FIGS. 5 and 6, the fork plugs 205 and conductor plates 204 are electrically connected by inserting the fork plugs 205 through the openings 216 in the partitioning wall 214.

FIG. 5 illustrates the arrangement of the different constituent elements of a semiconductor-component test device of the present invention. The cabinet 210 of the semiconductor-component test device has several sections. The lower part of the cabinet is separated into a chamber A and a chamber B. The power supply 132 is disposed in the chamber A. The chamber A and the chamber B are separated by a partitioning wall 215. The chamber C1 and the chamber C2 are separated by a partitioning wall 217.

The power supply 132, the switch circuit boards 201, and the transistor 117 generate considerable noise due to repeating on/off operations. On account of the noise, the circuit boards malfunction. Malfunction may be prevented by electrostatically shielding or electromagnetically shielding the partitioning walls of each chamber.

Electrostatic shields or electromagnetic shields are realized by installing, or else forming, plates that are conductive, metal plates, metallic films, or wire mesh surrounding, or on the partitioning-wall surface of, or in the interior of, each chamber.

In the chamber C1, the heating/cooling plate 134, the circulating water pipe 135 and the like, illustrated in FIGS. 2A and 2B, are disposed, and the transistor 117 that will be tested is placed in tight contact with the heating/cooling plate 134.

Along the periphery of the heating/cooling plate in the chamber C1, a water-leak sensor (not illustrated) is placed. With this configuration, if circulating water (coolant) or the like leaks, the water-leak sensor operates, halting the semiconductor-component test device or sounding an alarm.

Along the periphery of the heating/cooling plate 134, a drainage channel (not illustrated) is formed. With this configuration, if circulating water (coolant) leaks from the heating/cooling plate, the circulating water (coolant) flows into the drainage channel and is discharged outside the semiconductor-component test device. The heating/cooling plate 134 is mounted on a tray (not illustrated), and the tray is configured to be removable from the partitioning wall 214. As described above, the partitioning wall 214 is configured so that even if the circulating water pipe 135 and the like is damaged, the circulating water (coolant) or the like does not leak to the lower-side chambers A and B.

The partitioning wall 215 is formed between the chamber A, in which the power supply 132 is disposed, and the chamber B, in which the drive circuit system is placed. On the partitioning wall 215, an electrostatic shield plate or an electromagnetic shield plate is arranged, whereby noise from the power supply 132 is blocked off; noise will not be applied to the drive-circuit system in the chamber B.

In the embodiments of the present invention, the fork plugs 205 are plugged through the chamber C2 and connected to the conductor plates 204 in the chamber B. The partitioning wall 214 is formed with the openings 216 through which the fork plugs 205 are inserted.

In the embodiments of the present invention, the fork plugs 205 are inserted from the upper side into the lower side. The present invention is not limited to this. For example, the conductor plates 204 may be arranged in the chamber C2, and the fork plugs 205 may be inserted through the chamber B to electrically connect the fork plugs 205 and the conductor plates 204.

As illustrated in FIG. 13C, on the mother board 207, connectors 213 are installed. On the connectors 213 on the mother board 207, the control circuit board 111, the device-controlling circuit board 209, and the switch circuit boards 201 are installed. Switch circuit boards 201 corresponding to the number of transistors 117 that will be tested are prepared. A given number of switch circuit boards 201 may be easily realized by changing the number of switch circuit boards 201 installed on the mother board 207.

Transmitted to the mother board 207 are, inter alia, the temperature information Tj, the voltage Vi, a signal for controlling the variable resistor circuit 125, and a signal for controlling the constant-current circuit 118. Also, power-supply lines and ground connection lines for the respective circuits are formed, supplying the respective circuit boards via the connectors 213.

As illustrated in FIG. 13C, the conductor plates 204 are arranged to poke out beyond the switch circuit boards 201. These poking-out sections are connected to the fork plugs 205.

A fork plug 205a is connected to a conductor plate 204a on a switch circuit board 201a. A power-supply line 212 is connected to the switch circuit board 201a through an opening 216 in the partitioning wall 215.

As illustrated in FIGS. 1 and 5, a fork plug 205d is connected to a conductor plate 204c on a switch circuit board 201a. A power-source line 212 is connected to the switch circuit board 201a through an opening 216 in the partitioning wall 215. A fork plug 205b is connected to a conductor plate 204b on a switch circuit board 201b. A power-source line 212 is connected to the switch circuit board 201b through an opening 216 in the partitioning wall 215.

As illustrated in FIG. 1 and FIGS. 4A and 4B, between the conductor plate 204d and the conductor plate 204c on the switch circuit board 201a, a switch circuit 124a is placed for electrically short-circuiting the conductor plate 204*d* and the conductor plate 204*c*. By the short-circuiting, the current Id that the power supply 132 outputs is supplied to the transistor 117 as a test current Id.

As illustrated in FIGS. 4A and 4B, between the conductor plate 204*a* and the conductor plate 204*b* on the switch circuit board 201*b*, a switch circuit 124*b* is disposed. By the switch circuit 124*b* being on, the conductor plate 204*a* and the conductor plate 204*b* are short-circuited. By the short-circuiting, the current Id that the power supply 132 outputs flows to ground as a discharge current Im. Therefore, with no voltage being applied across the channel of the transistor 117 and no current being made to flow in the transistor 117, no overvoltage nor overcurrent is applied to the transistor 117 and other the electrical components.

On the conductor plate 204*b* a fork plug 205*c* is connected. On the conductor plate 204*b* the fork plug 205*b* is connected. Further, on the conductor plate 204*d* a fork plug 205*e* is connected. On the conductor plate 204*c* a fork plug 205*d* is connected.

The substance of the fork plugs 205 consists of a metal such as aluminum. For the fork plugs 205, a plating substrate is nickel-treated and the surface is plated with silver. The fork plugs 205 are formed with a threaded groove, thus being configured so that the connection lines 211 may be attached to the fork plugs 205 with the connection bolts 219.

FIG. 5 illustrates the two boards, switch circuit board 201*a* and switch circuit board 201*b*. The switch circuit boards 201 are connected with the connectors 213 on the mother board 207.

As illustrated in FIGS. 5 and 6, the fork plug 205*c* is plugged through an opening 216 in the partitioning wall 214 provided between the C2 chamber and the B chamber, and is connected to the conductor plate 204*b*. The fork plug 205*e* is plugged through an opening 216 in the partitioning wall 214 provided between the C2 chamber and the B chamber, and is connected to the conductor plate 204*d*.

Since the current made to flow in the transistor 117 being tested is a large several hundred amperes, the thickness of the connection lines 211 employed is also large. On that account, the thick connection lines 211 and power-supply lines 212 are stiff. Consequently, altering the connection-line 211 and power-supply-line 212 connections is not easy.

In the semiconductor-component test device of the present invention, the fork plugs 205 are inserted through the C2 chamber into openings 216 of choice in the partitioning wall 214. Changing the location of the openings 216 through which they are inserted allows the fork plugs 205 to be connected to a switch circuit board 201 of choice. Thus, changing based on the conditions for testing the transistor 117 the connection with the switch circuit board 201 employed does not require wire-connect altering the connection lines 211, but only changing the location of the openings 216 through which the fork plugs 205 are inserted. Moreover, as illustrated in FIG. 13C, for the switch circuit boards 201, simply changing the position of the connector 213 connected to the motherboard 207 is sufficient.

As described above, the switch circuit boards 201 and the device-control circuit board 209 connected to the motherboard 207 are arranged according to the content of the test for the electrical component 117 or other semiconductor component, and the number of electrical components 117 being tested. Moreover, switching connections with the switch circuit boards 201 is implemented by changing the locations of the fork plugs 205 inserted in the openings 216 in the partitioning wall 214.

As illustrated in FIGS. 1, 4A and 4B, 5, and 6, the connection line 211*b* connected to the transistor 117 is connected to the fork plug 205*c*. The connection line 211*a* connected to the transistor 117 is connected to the fork plug 205*e*. The semiconductor component 117 being tested can be detached from the test circuit by detaching the fork plug 205*c* and the fork plug 205*e* from the conductor plates 204.

As illustrated in FIGS. 4A and 4B and elsewhere, it is sufficient that switch circuit boards 201*b* for short-circuiting the output of constant-current circuits 121 are of a quantity corresponding the number of constant-current circuits 121. For example, when the semiconductor-component test device has one constant-current circuit 121, one switch circuit board 201*b* (switch circuit 124*b*) will be sufficient.

A number of switch circuit boards 201*b* that corresponds to the number of transistors 117 being tested is necessary. For example, if twelve transistors 117 are to be tested, it is preferable that twelve switch circuit boards 201*b* be prepared. Specifically, a switch-circuit board count corresponding to the number of 117 electrical components to be tested is prepared.

Having the board specifications of the switch circuit board 201*a* for testing the electrical component 117 and the switch circuit board 201*b* for short-circuiting the output of the power supply 132 be the same is advantageous in terms of cost. That is, the switch circuit boards 201 would have a common configuration.

It is preferable that the switch circuit boards 201 be severally populated with transistors as the switch circuits 124. The more numerous are the switch circuits 124, the more the impedance for short-circuiting between two conductor plates 204 can be lessened.

Figures 14A, 14B:
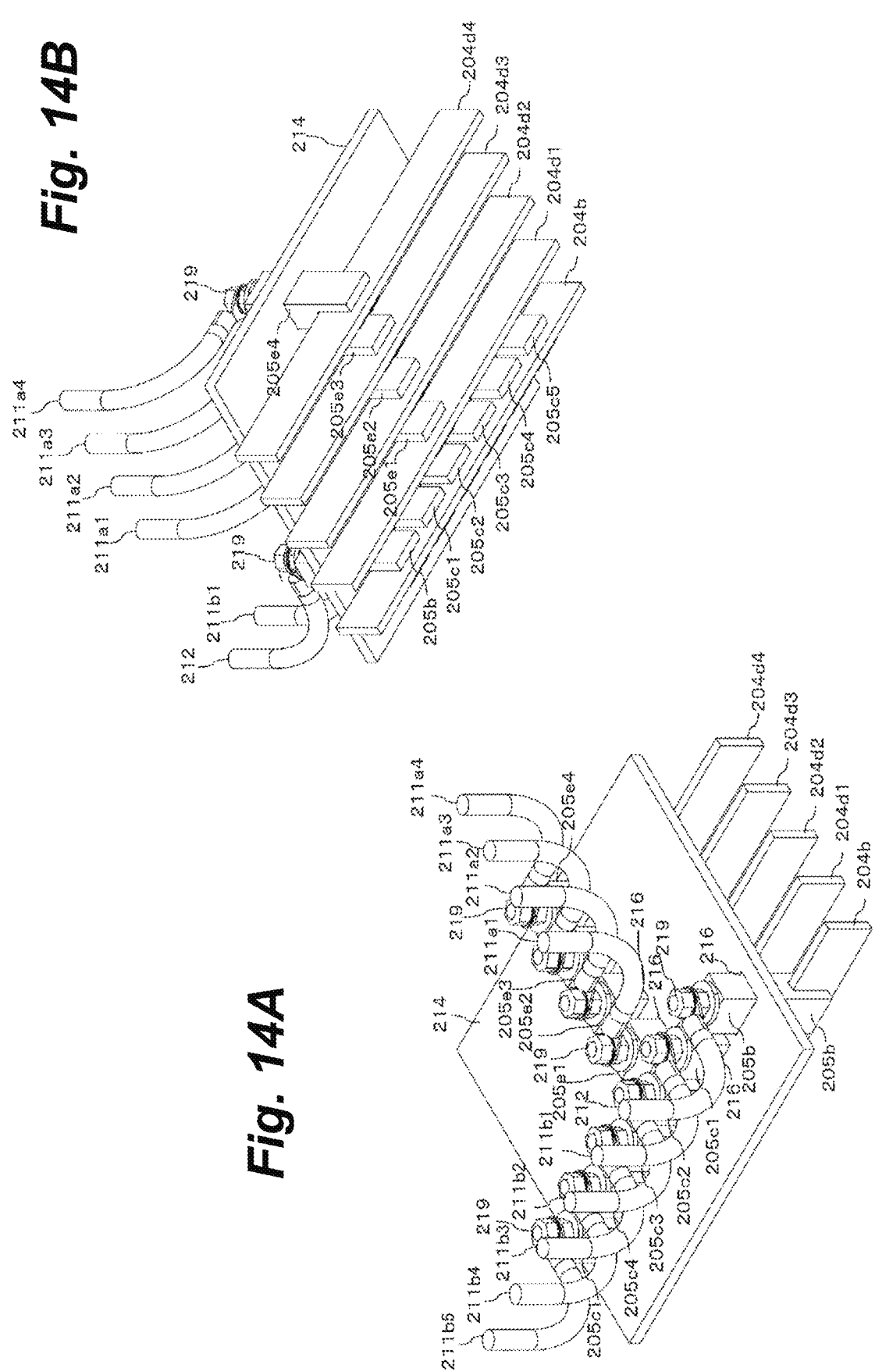
FIGS. 14A and 14B are explanatory and configurational diagrams of an electrical connection unit of a semiconductor-component test device of the present invention.

FIGS. 14A and 14B illustrate a state in which fork plugs 205 have been inserted in openings 216 in the partitioning wall 214. FIG. 14A is a view seen from the front side of the partitioning wall 214, and FIG. 14B is a view seen from the reverse side of the partitioning wall 214.

To the conductor plate 204*b* in FIGS. 14A and 14B, as an example, a fork plug 205*b* and a plurality of fork plugs 205*c* (fork plugs 205*c*1 to 205*c*5) are connected. A fork plug 205*e*1 is connected to the conductor plate 204*d*1, a fork plug 205*e*2 is connected to the conductor plate 204*d*2, a fork plug 205*e*3 is connected to the conductor plate 204*d*3, a fork plug 205*e*4 is connected to the conductor plate 204*d*4, and a fork plug 205*e*5 is connected to the conductor plate 204*d*5.

By the switch circuits 124 on the switch circuit boards 201 going on/off, significant noise is generated. As a countermeasure, although not illustrated in FIG. 13C, a metal plate that functions as a shield is disposed between the two switch circuit boards 201, and the metal plate is connected to ground.

The heat generated by the switch circuits 124 is dissipated in the conductor plates 204. Heat sinks (not illustrated) are installed on the switch circuits 124. The ground terminal of the switch circuits 124 is connected to ground on the switch circuit boards 201. The heat of the conductor plates 204 is also dissipated via the grounding copper foil on the switch circuit boards 201.

As illustrated in FIG. 1 and FIGS. 4A and 4B, the conductor plate 204*a* and the conductor plate 204*b* are attached to the switch circuit board 201*b*. The conductor plate 204*a* is connected with the fork plug 205*a*. The fork plug 205*a* is connected with an output terminal of the power supply 132. The conductor plate 204*b* is connected with the fork plug 205*b*. The fork plug 205*b* is connected with a ground terminal of the power supply 132.

When the switch circuit 124*b* is switched on (closed), the output terminals of the power supply 132 are short-circuited, and a short-circuit current Im flows to ground. Consequently, the output current of the power supply 132 is not supplied to the transistor 117. When the switch circuit 124*b* is open, an output current Id of the power supply 132 is supplied to the transistor 117.

The conductor plate 204*c* and the conductor plate 204*d* are mounted on the switch circuit board 201*a*. The conductor plate 204*c* is connected with the fork plug 205*d*. The fork plug 205*d* is connected with the output terminal of the power supply 132. The conductor plate 204*d* is connected with the fork plug 205*e*. The fork plug 205*e* is connected with the collector terminal of the transistor 117 being tested.

With the configuration of FIGS. 14A and 14B, the connection lines 211 attached to the fork plugs 205 prove to be complex. Moreover, with the connection lines 211 obstructing, inserting the fork plugs 205 in the openings 216 is made difficult.

Figure 15:
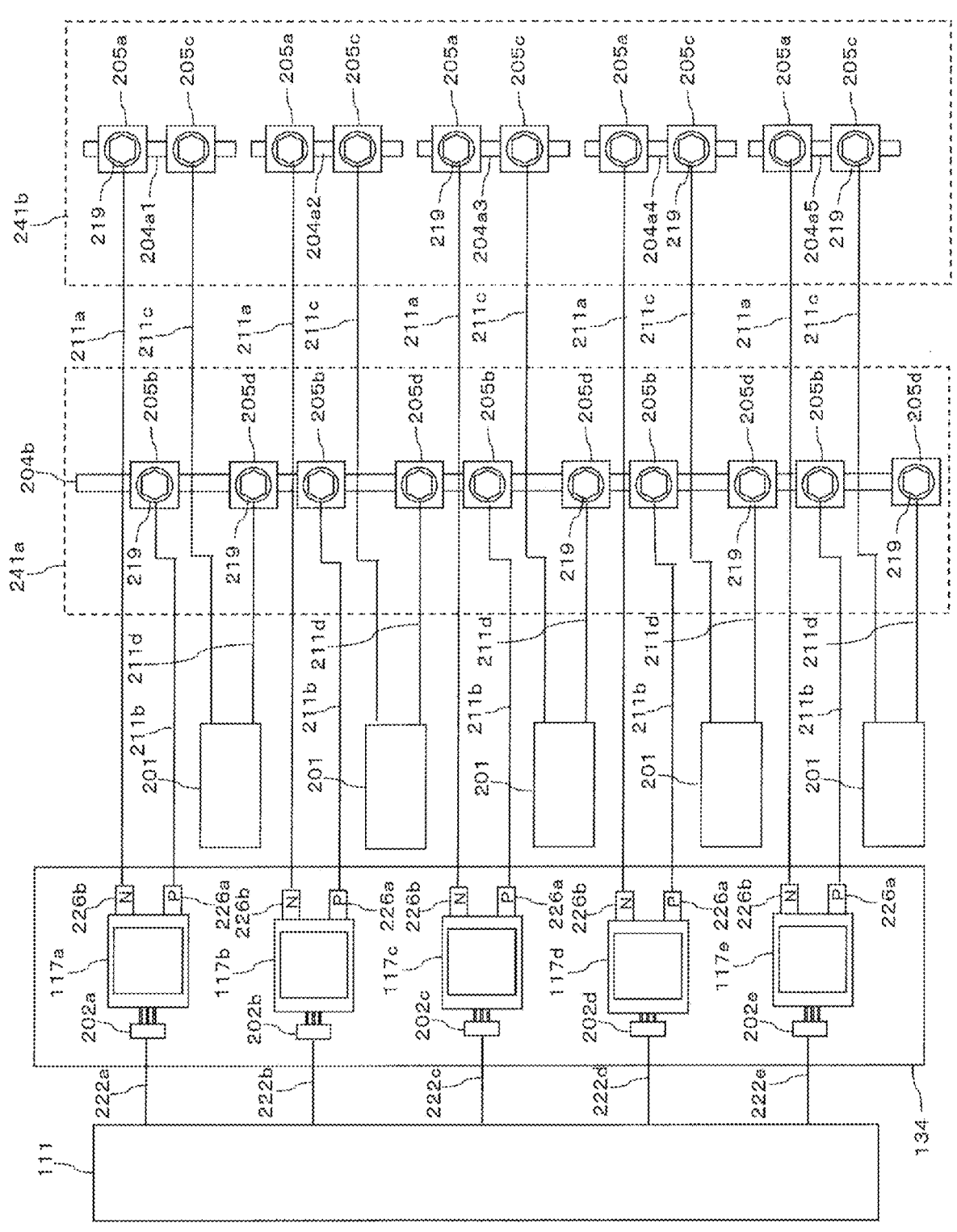
FIG. 15 is an explanatory diagram and configurational diagram of an electrical connection unit of a semiconductor-component test device of the present invention.

The present invention, as illustrated in FIG. 15, separates the row-wise position of the fork plugs 205 connected to the common conductor plate 204*b* from the row-wise position of the fork plugs 205 connected to one or a plurality of conductor plates 204*a*.

Figure 16B:
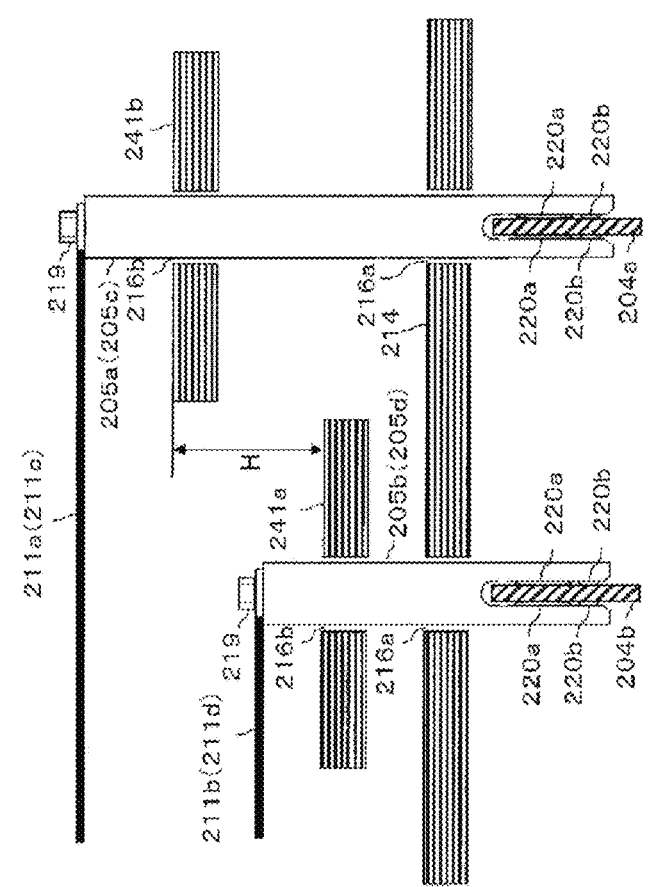
FIGS. 16A and 16B are explanatory and configurational diagrams of an electrical connection unit of a semiconductor-component test device of the present invention.
Figure 16A:
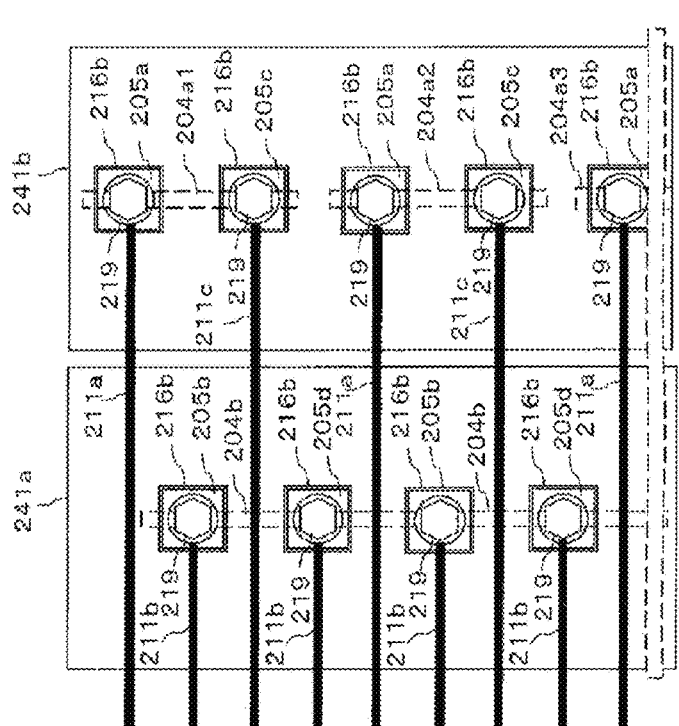

FIGS. 15, 16A, and 16B are diagrams for explaining a technical concept of the present invention. In FIG. 15, as an example, three or more fork plugs 205*b* and a conductor plate 204*b* connecting the fork plugs 205*d* are arranged. A plurality of fork plugs 205*b* and a plurality of fork plugs 205*d* are attached to the conductor plate 204*b*.

Conductor plates 204*a*1 to 204*a*6 connecting the fork plugs 205*a* and the fork plugs 205*c* are arranged, with fork plugs 205*a* and fork plugs 205*c* being attached to each of the conductor plates 204*a*1 to conductor plate 204*a*6.

The conductor plates 204*a*1 to 204*a*6 are disposed rectilinearly. Furthermore, the respective conductor plates 204 are disposed so that the conductor plates 204*a* are virtually parallel with the conductor plate 204*b*.

A terminal 226*a* of the transistor 117 is connected to the fork plug 205*b* via the connection line 211*b*. A terminal 226*b* of the transistor 117 is connected to the fork plug 205*a* via the connection line 211*a*.

A first terminal of the switch circuit board 201 is connected to the fork plug 205*d* via the connection line 211*d*. A second terminal of the switch circuit board 201 is connected to the fork plug 205*c* via the connection line 211*c*.

The fork plug 205*a* and the fork plug 205*c* are made electrically common by the conductor plate 204*a*, and the fork plug 205*b* and the fork plug 205*d* are made electrically common by the conductor plate 204*b*.

The fork plugs 205 are respectively inserted in the rectilinearly disposed openings 216. Accordingly, thanks to the fork plugs 205 being rectilinearly disposed, the respective connection lines 211 are disposed in parallel. The semiconductor components 117 being tested are also rectilinearly disposed, atop the heating/cooling plate 134.

As illustrated in FIG. 16A, in a fork-plug insertion plate 241*a* openings 216*b* are formed, and in a fork-plug insertion plate 241*b* openings 216*b* are formed. The openings 216*b* in the fork-plug insertion plate 241*a* are arranged stretching along the conductor plate 204*b*. The openings 216*b* in the fork-plug insertion plate 241*a* are arranged stretching along the conductor plate 204*a*.

The connection line 211*a*, the connection line 211*b*, the connection line 211*c*, and the connection line 211*d* are connected to their respective fork plugs 205, and the connection lines 211 are disposed virtually in parallel.

Arranging the connection lines 211 virtually in parallel eliminates crisscrossing or the like of the connection lines 211 as illustrated in FIGS. 14A and 14B, facilitating inserting of the fork plugs 205 in the openings 216. Accordingly, switching among which of the transistors 117*a* to 117*e* is to be tested is facilitated by inserting or not inserting the fork plugs 205 into the openings 216.

As illustrated in FIG. 16B, the fork-plug insertion plate 241*a* and the fork-plug insertion plate 241*b* are configured or formed so as to have a stepped differential of height H perpendicularly.

In the fork plug insertion plate 241*a* and the fork plug insertion plate 241*b* opening 216*b* are formed. In the partitioning wall 214 openings 216*a* are formed. The fork plugs 205 are inserted in the openings 216*a* and the openings 216*b*, wherein the fork plugs 205 are supported by the openings 216*a*, the openings 216*b*, and the conductor plates 204. Accordingly, support of the fork plugs 205 is made firm.

As illustrated in FIGS. 16A and 16B, the connection lines 211*b* and the connection lines 211*d* are situated in lower-level positions, and the connection lines 211*a* and the connection lines 211*c* are situated in upper-level positions. Therefore, the wiring position spaces for the connection lines 211*b* and the connection lines 211*d*, and for the connection lines 211*a* and the connection lines 211*c* differ vertically, such that crisscrossing or the like of the connection lines 211 does not occur. Therefore, attachment/detachment, press-fitting, etc. of the fork plugs 205 inserted in the openings 216 is facilitated. It will be appreciated that the features described above with FIG. 15, FIGS. 16A and 16B and elsewhere can be applied to other embodiments of the present invention and can be combined with other embodiments.

FIG. 6 illustrates a single transistor 117 for ease of illustration. A connecting structure 218*a* is inserted into an opening 216*a* in the partitioning wall 217, and a connecting structure 218*b* is inserted into an opening 216*b* in the partitioning wall 217.

In the semiconductor test device of the present invention, a plurality of semiconductor components 117 is placed on a heating/cooling plate 134 to carry out testing. Accordingly, as illustrated in FIG. 2B, a plurality of openings 216 is formed in the partitioning wall 217.

In FIG. 2B, n (n a positive number of 1 or greater) openings 216 are formed. The connecting structure 218*a*1 is inserted in the opening 216*a*1, and the connecting structure 218*b*1 is inserted in the opening 216*b*1. The connecting structure 218*a*2 is inserted in the opening 216*a*2, and the connecting structure 218*b*2 is inserted in the opening 216*b*2. The connecting structure 218*an* is inserted in the opening 216*an*, and the connecting structure 218*bn* is inserted in the opening 216*bn*. The connecting structure 218*a* is connected with the component terminal 226*a* of the transistor 117, and the connecting structure 218*b* is connected with the component terminal 226*b* of the transistor 117.

A connector 202 is connected to the terminal of the transistor 117, and signal lines 222 connected to the connector 202 are connected to the sample connection circuit 203. Signal lines 235 from the sample connection circuit 203 are connected to the device-control circuit board 209 via the connector 208.

The partitioning walls (bulkhead 214, bulkhead 215, bulkhead 217) have the function of separating the respective chambers (chamber C1, C2 chamber, chamber A, B chamber) and the function of making it so that outside air does not flow in. Especially, since dew condensation sometimes occurs in the C1 chamber in a test in a low-temperature state, dry air is made to flow into the C1 chamber.

Fixing screws 221 are attached to the other end of the connecting structures 218, wherein the connection lines 211 are connected to the connecting structures 218. Fork plugs 205 as connecting members are attached to the other end of the connection lines 211. The fixing screws 221 are not limited to screws; they may be anything as long as it allows electrically connecting the connection lines 211 to the connecting structures 218.

The sample connection circuit 203 is connected to the device-control circuit board 209 by the connection pins 206 on the connector 208. A sample connection circuit 203 is arranged individually corresponding to each transistor 117 being tested, wherein the sample connection circuits 203 are configured to be enable their easy removal.

Figures 7A, 7B:
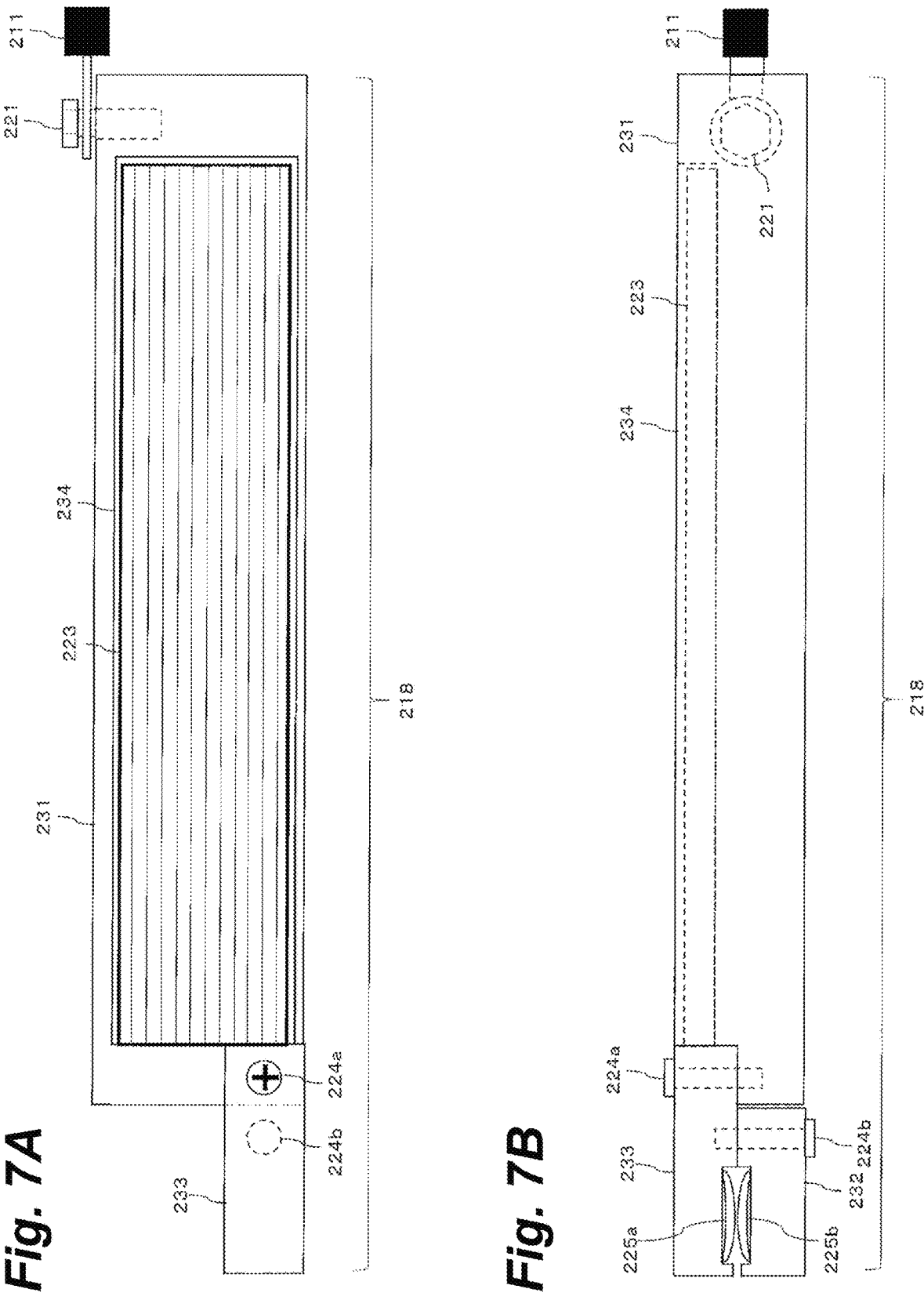
FIGS. 7A and 7B are explanatory and configurational diagrams of a heat-pipe section of the present invention.

FIGS. 7A and 7B are explanatory diagrams of a connecting structure 218 that is one embodiment in semiconductor-component test devices of the present invention. FIG. 7A is a view schematically illustrating the reverse side, and FIG. 7B is a view schematically illustrating a lateral side.

A heat pipe 223 is tightly adhered to a recess 234 in the connecting structure 218. Thermally conductive grease as well as a heat-dissipating silicone oil compound may be applied between the recess 234 in the connecting structure 218 and the heat pipe.

The heat pipe 223 is arranged snugly fit into the recess 234. Arranging the heat pipe 223 in the recess on the reverse side of the connecting structure 218, lowers the risk that the heat pipe 223 will be damaged. Heat pipes 223 may be placed on either side of the connecting structure 218.

The connecting structures 218 become heated during a test. Accordingly, the heat pipe 223 and its heat pipe fixture 231 are also heated. By being heated, the heat pipe 223 and the heat pipe fixture 231 expand.

In the present invention, materials are adopted in which the linear expansion coefficient of the heat pipe fixture 231 in the connecting structures 218 is smaller than the linear expansion coefficient of the heat pipe 223 pipe. Alternatively, materials are adopted in which the linear expansion coefficient of the heat pipe 223 pipe in the connecting structures 218 is larger than the linear expansion coefficient of the heat pipe fixture 231. With the heat pipe 223 material being inside the recess 234, the expansion grows large, wherein the heat pipe 223 becomes firmly set-in by the recess 234. Accordingly, the heat pipe 223 will not come off.

As the material of the heat pipe fixture 231, copper (linear expansion coefficient 16.8), brass (linear expansion coefficient 19), iron (linear expansion coefficient 12.1), and (SUS304) stainless steel (linear expansion coefficient 17.3) are exemplarily illustrative. As the material of the heat pipe 223, materials having a coefficient of linear expansion larger than that of the heat pipe fixture 231, e.g., aluminum (linear expansion coefficient 23), tin (linear expansion coefficient 26.9), and lead (linear expansion coefficient 29.1) are exemplarily illustrative. Among these, adopting copper (linear expansion coefficient 16.8) as the material of the heat pipe fixture 231, and aluminum (linear expansion coefficient 23) as the material of the heat pipe 223 is preferable. For the heat pipe fixture 231, apart from metals, carbon or the like may be employed.

Figure 9:
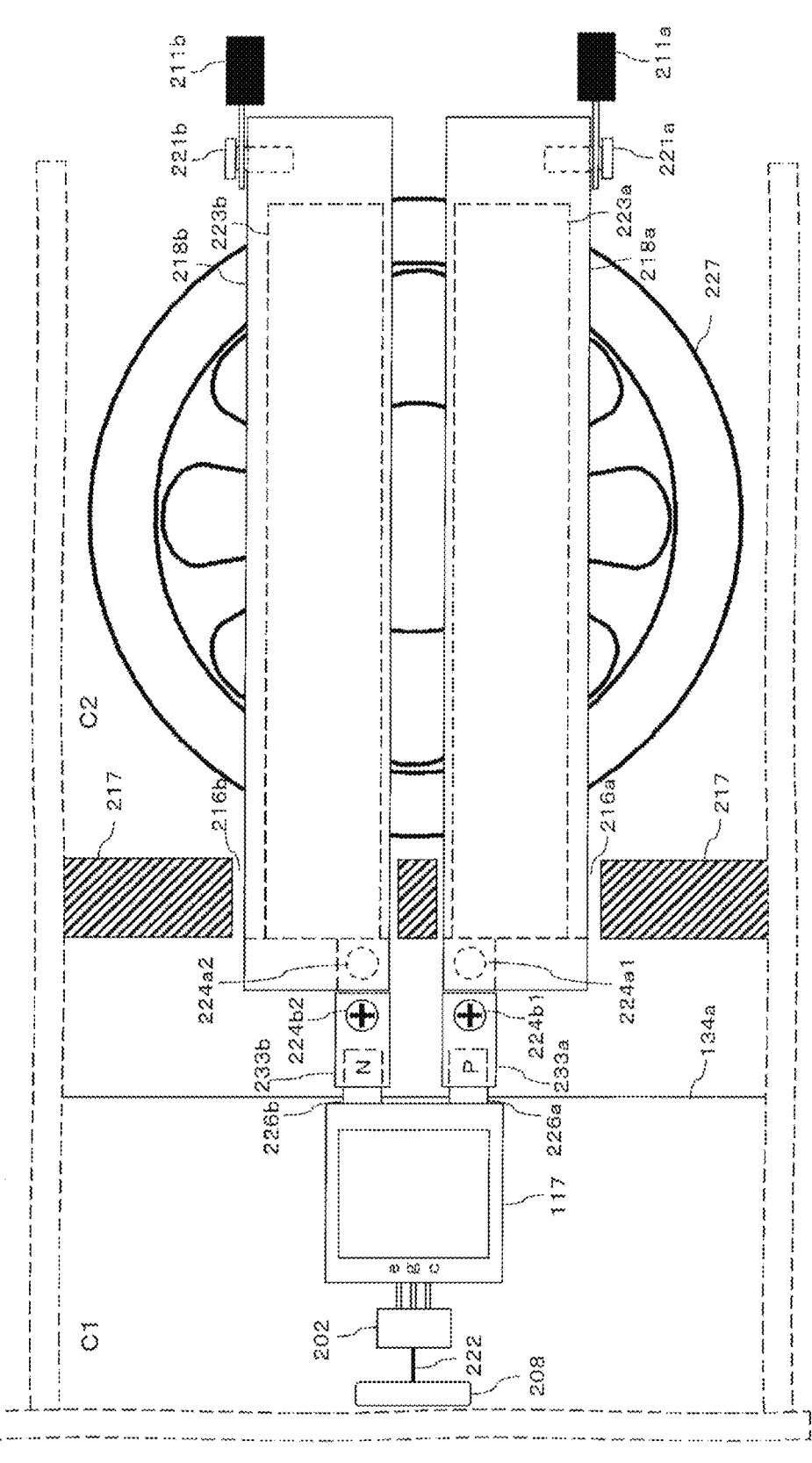
FIG. 9 is an explanatory and configurational diagram of a semiconductor-component mounting section of the present invention.

The connecting structures 218 chiefly consist of a heat pipe fixture 231, a connection pressuring part 232, and a connection retaining part 233. The component terminals 226 of the semiconductor component are plugged in between connection pressuring parts 232 and connection retaining parts 233. FIG. 9 is an explanatory diagram illustrating a connection state between the transistor 117 and the connecting structures 218. Heat pipes 223 are disposed on the reverse sides of the connecting structures 218.

The transistor 117 is fixed tightly adhered to the heating/cooling plate 134a. The fixing is accomplished by the pressing force of a spring (not illustrated). According to necessity, a heating/cooling plate is also arranged on the upper side of the transistor 117 to make it so that the transistor 117 may be set to predetermined temperature conditions.

Since it is necessary that the transistor 117 on which testing is conducted be fixed tightly adhered to the heating/cooling plate 134, removing the transistor readily is challenging. A transistor 117 installation job begins with fixing to the heating/cooling plate 134 a plurality of transistors 117 on which testing will be conducted. Next, a transistor 117 on which testing will be conducted is selected, and the connecting structures 218 are inserted through the openings 216 in the partitioning wall 217 and attached to the component terminals 226 of the semiconductor component 117.

That is, electrical connection of the selected transistor 117 with the component terminals 226 is accomplished by the connecting structures 218 being inserted, through the C2 chamber side, in the openings 216 where the selected transistor 117 is located.

Electrical connection with the transistor 117 is facile since only the positions where the connecting structures 218 are inserted are selected. What is more, changing the applied signal on the connection lines 211 connected to the connecting structures 218 makes changing the transistor 117 test conditions and test contents easy.

Connection lines 211 are connected to one end of the connecting structures 218, and a constant current Id is applied to the transistor 117 through the connection lines 211. On the reverse side of the connecting structure 218, the heat pipe 223 is disposed.

A current of several hundred amperes (A) flows through the component terminals 226. Even if in their contacts 225 is a slight resistance, due to the current of several hundred amperes (A) considerable heat is generated, overheating the component terminal 226 section. If the component terminal 226 overheats, the transistor 117 overheats, such that the transistor 117 is deteriorated or else destroyed.

In the present invention, the heat generated in the component terminals 226 is thermally transmitted to the connection line 211 side of the connecting structure 218 by the heat pipe 223. Therefore, the contacts 225 will not overheat. A cooling fan 227 is arranged on the underside of the connecting structure 218 to dissipate heat from the heat pipe 223.

Figure 8A:
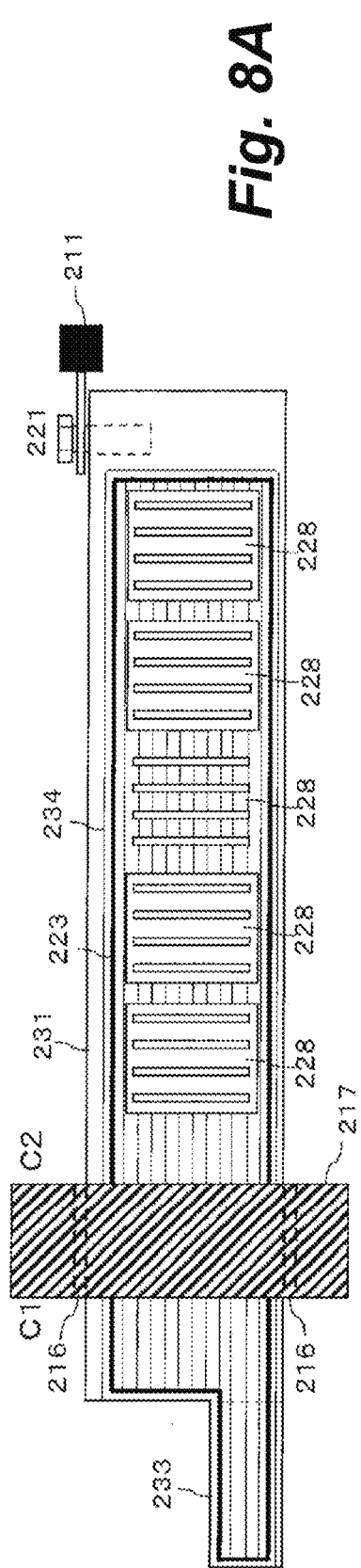
FIGS. 8A and 8B are explanatory and configurational diagrams of a heat-pipe section of the present invention.
Figure 8B:
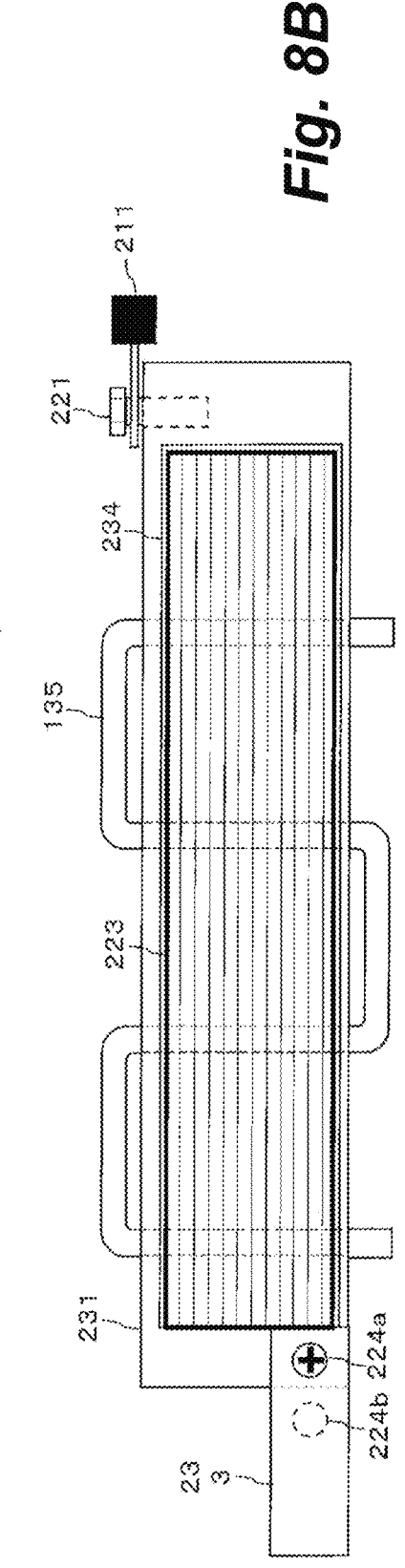

As illustrated in FIG. 8A, heat-radiating fins 228 may be formed or arranged tightly adhered to the heat pipe 223. As illustrated in FIG. 8B, the circulating water pipe 135 may be formed or arranged inside the connecting structure 218 to cool the connecting structure 218.

Figure 10:
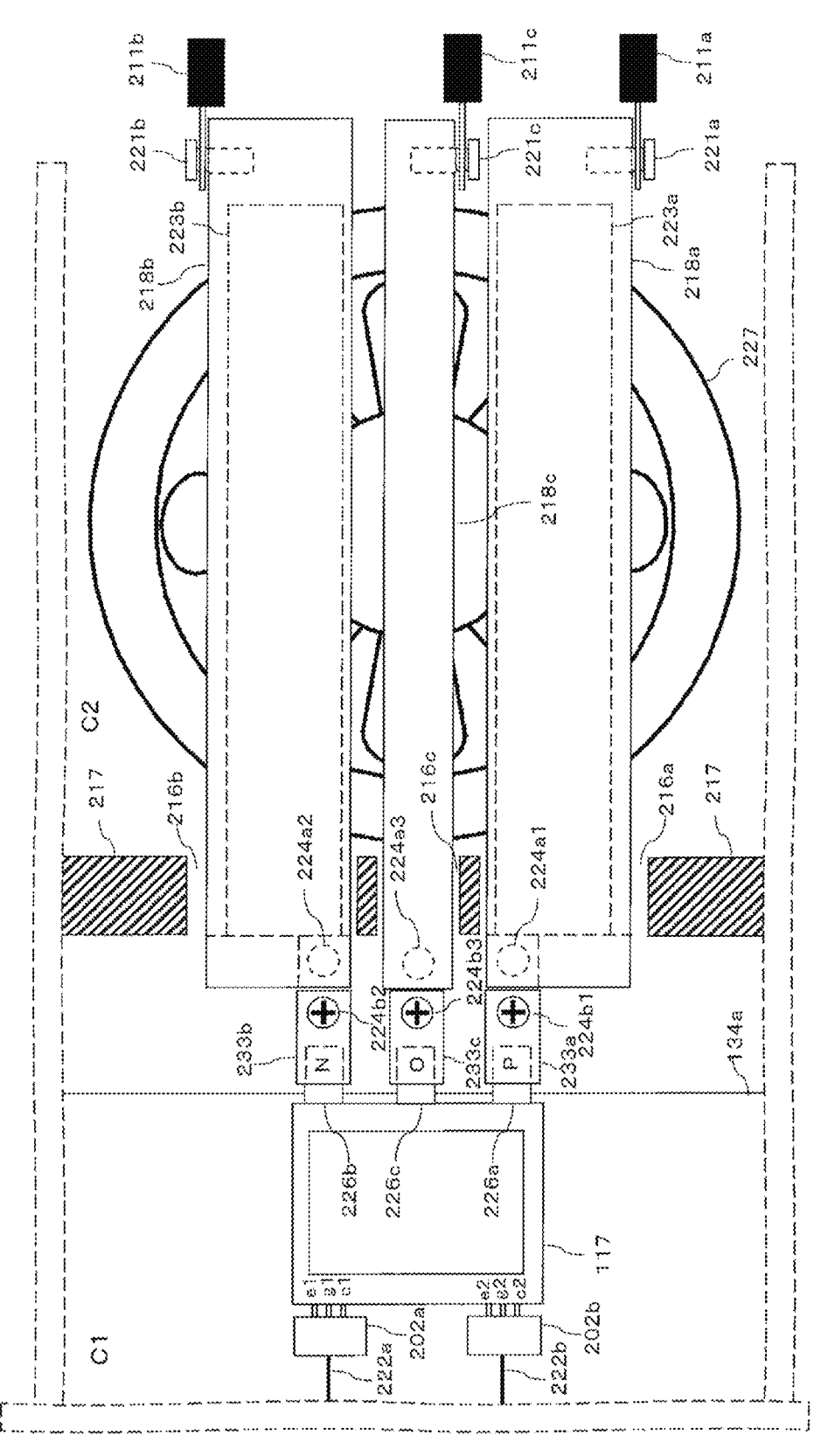
FIG. 10 is an explanatory and configurational diagram of a semiconductor-component mounting section of the present invention.

In FIG. 9, the transistor 117 (semiconductor component 117) has two component terminals 226, the component terminal 226a (P) and the component terminal 226b (N). As illustrated in FIG. 10, the technical concepts of the present invention may be applied even with there being three component terminals 226 on the transistor 117: the component terminal 226a (P), the component terminal 226b (N), and the component terminal 226c.

FIG. 10 is an explanatory diagram illustrating a state of connection between a semiconductor module 117 having three component terminals 226 (component terminal 226a (P), component terminal 226*b* (N), and component terminal 226*c* (O)) such as those in FIGS. 3B, 3C, 3D, and 3E, and a connecting structure 218.

In FIG. 10, a heat pipe 223*a* is formed or arranged on the connecting structure 218*a*, and a heat pipe 223*b* is formed or arranged on the connecting structure 218*b*, whereas a heat pipe 223 is not formed or arranged on the connecting structure 218*c*. The connecting structure 218*c* is connected to the component terminal 226*c*. Large current does not flow in the component terminal 226*c* (O) of the transistor 117. It is not necessary to form a heat pipe 223 on the connecting structure 218*c*.

Forming the connecting structure 218*c* thinner than the other connecting structures 218 (connecting structure 218*a*, connecting structure 218*b*), facilitates connection between the connecting structures 218 and the component terminals 226 of the transistor 117. What is more, since it is all right that the space in which the transistors 117 are disposed be narrow, the number of transistors 117 that may be loaded onto the heating/cooling plate 134 can be made numerous.

Figures 11A, 11B, 11C, 11D:
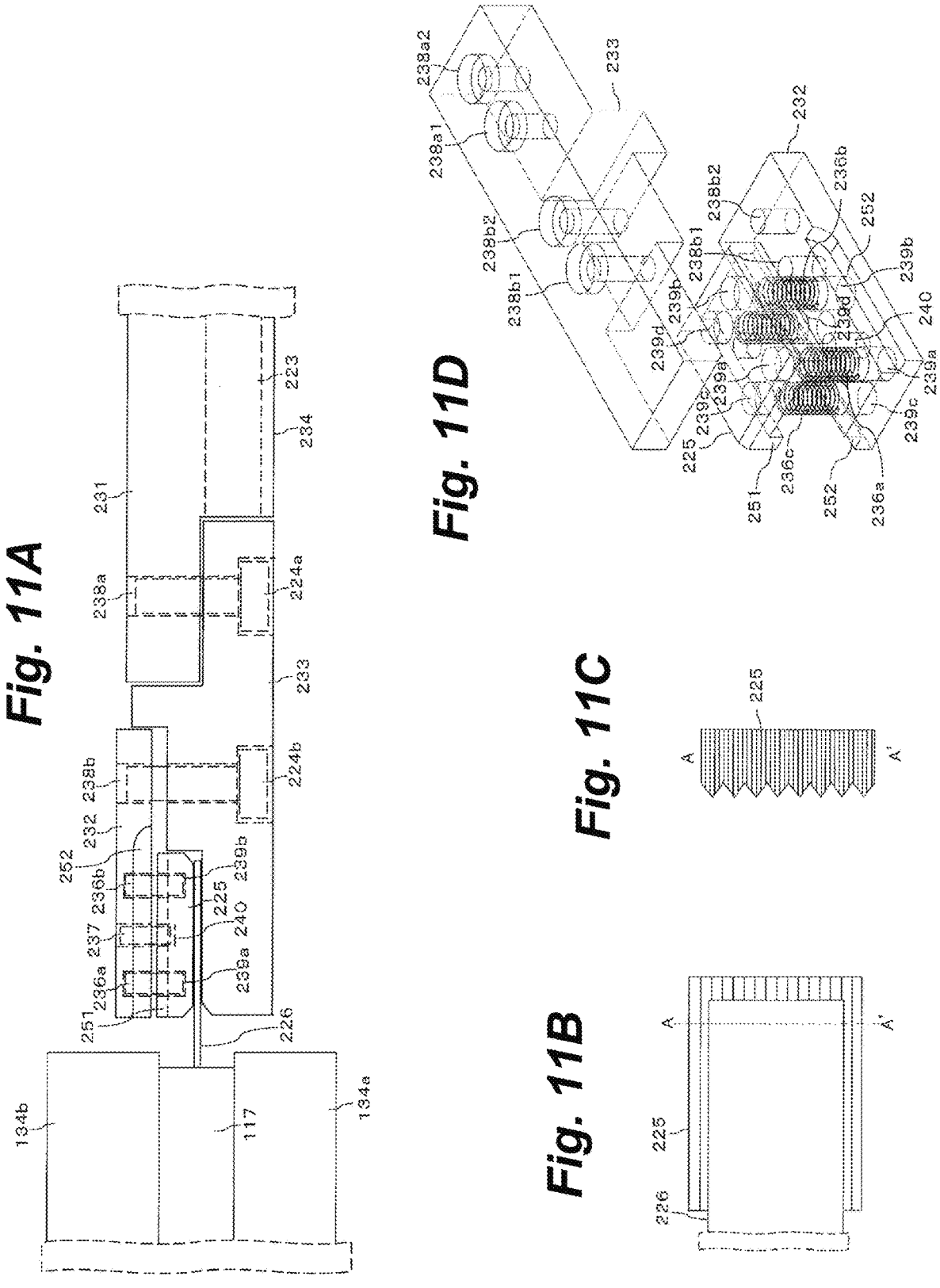
FIG. 11A through 11D are explanatory and configurational diagrams of a semiconductor-component mounting section of the present invention.

As illustrated in FIG. 11A, a connecting structure 218 in another embodiment of the present invention chiefly consists of a heat pipe fixture 231, a connection receiving part 225, a connection pressuring part 232, and a connection retaining part 233. The component terminal 226 of a semiconductor component is plugged in between the connection receiving part 225 and the connection retaining part 233.

Springs 236 are inserted or arranged in spring holes 239 in the connection receiving part 225 and the connection pressuring part 232. In an aligning screw hole 240 in the midportion of the connection receiving portion 225, an aligning screw 237 is inserted or disposed, thereby aligning the connection receiving part 225 and the connection pressuring part 232.

The springs 236 are pressing means, or are sliding means, or are positioning means. Coil springs exemplify one example of the springs 236. They are otherwise exemplified by leaf springs, spiral springs, and Belleville springs. The springs 236 are formed with, or else constituted by, a metallic material. They may be formed of heat-resistant rubber, plastic, or ceramic material.

The coil springs 236 are arranged between the connection receiving part 225 and the connection pressuring part 232. The connection pressuring part 232 is connected by one or more fixing screws 224*b*. By tightening or otherwise attaching the fixing screws 224*b*, pressure (pressing force) is applied between the connection receiving part 225 and the connection retaining part 233.

The component terminals 226 are sandwiched between the connection receiving part 225 and the connection retaining part 233, wherein due to the pressure of the springs 236, the component terminals 226 are clasped between the connection receiving part 225 and the connection retaining part 233 by a predetermined pressure (predetermined pressing force).

The pressure (pressing force) may be easily adjusted by changing the springs 236. Moreover, the pressure (pressing force) may be adjusted or else set by the degree of fixing screw 224*b* tightening. The heat pipe fixture 231 and the connection retaining part 233 are fixed by one or more fixing screws 224*a*.

The connection receiving part 225 is arranged between the connection pressuring part 232 and the connection retaining part 233. Platinum, gold, silver, tungsten, copper, nickel, molybdenum, or an alloy in which they are combined is utilized as a constituent material or else at least a surface material of the connection receiving part 225.

Likewise, platinum, gold, silver, tungsten, copper, nickel, molybdenum, or an alloy in which they are combined is utilized as a surface constituent material on the surface where the connection retaining part 233 contacts the component terminals 226.

The connection retaining part 233 is fixed to the heat pipe fixture 231 with a fixing screw 224*a*. The connection pressuring part 232 is fixed to the connection retaining part 233 with a fixing screw 224*b*. A connection line 211 is fixed to the left end of the heat pipe fixture 231 with a fixing screw 221. FIGS. 11A and 11D are explanatory diagrams for explaining a state of the combination among the connection retaining part 233, the connection receiving part 225, and the connection pressuring part 232.

By screws 224*a* inserted (not illustrated) into a threaded hole 238*a*1 and a threaded hole 238*a*2, the connection retaining part 233 is fixed, connecting the heat pipe 223 and the heat pipe fixture 231 with each other. The heat pipe 223 and the heat pipe fixture 231 are anchored by being connected tightly adhered, so that their thermal conductivity and electrical conductivity will be ideal. Furthermore, by screws 224*b* inserted (not illustrated) into a threaded hole 238*b*1 and a threaded hole 238*b*2, the connection retaining part 233 is anchored connected with the connection pressuring part 232.

The connection receiving part 225 has a protrusion 251 formed on either edge, and the connection pressuring part 232 has a channel 252 formed on either edge. The protrusions 251 on the connection receiving part 225 are fitted into the channels 252 in the connection pressuring part 232. The protrusions 251 on the connection receiving part 225 and the channels 252 in the connection pressuring part 232 are configured to be in electrical contact.

In order to make the contact quality between the component terminals 226 and the connection receiving part 225 ideal, as illustrated in FIG. 11C, it is preferable to form jags such as triangular forms in the surface of the connection receiving part 225. The configuration in FIG. 11A through 11D is a construction that clasps the component terminals 226 between the plane of the connection pressuring part 232 and the plane of the connection retaining part 233.

FIG. 12A through 12D are a construction that clasps the component terminals 226 between the presser mounting plate 313 and the connection retaining part 233. To the presser mounting plate 313, pressers 311*a* and pressers 311*b* are attached. The pressers 311 are exemplarily illustrated by, e.g., leaf springs made of metal. The pressers 311 may be formed of a non-conductive material such as a silicon resin material. The pressers 311 are fitted into the presser mounting plate 313.

The component terminals 226 are clasped between the plane of the pressers 311 and the connection retaining part 233. The component terminals 226 and the connection retaining part 233 are electrically connected by the pressing force of the presser 311.

In the embodiment of FIG. 11A, the springs (pressuring fixtures) 236 were inserted in the spring holes 239 in the contact 225. In instances in which the springs (pressuring fixtures) 236, contact 225, and connection pressuring part 232 are constituted by a conductive material, in some cases electricity flows component terminals 226→contact part 225→springs (pressuring fixtures) 236→connection pressuring part 232. In this case, if the value of the spring (pressuring-fixture) 236 resistance is large, current will flow through the springs (pressuring fixtures) 236, such that the springs generate heat subjecting them to burnout.

In the embodiment of the present invention in FIG. 12A through 12D, the spring holes 312 are formed in an insulating plate 312. The presser 311 comes into contact with the component terminals 226, and the springs 236 press on the presser mounting plate 313. The insulating plate 312 is arranged on the upper side of the presser mounting plate 313, insulating between the presser mounting plate 313 and the springs 236. Spring holes 239 are formed in the insulating plate 312, and springs 236 are inserted into the spring holes 239. Since the rest of the configuration is the same as that of FIG. 11A through 11D, the description thereof is omitted. The insulating plate 312 may be an insulating film, an insulating membrane, an insulating gas such as air, or the like.

FIG. 12B is a view seen from a lateral side of the presser mounting plate 313. Pressers 311a and pressers 311b are arranged/inserted in the presser mounting plate 313. FIG. 12C is a view seen from the A direction in FIG. 12B.

Since the insulating plate 312 is constituted by an insulating material, even if the presser mounting plate 313 is an electroconductive substance such as metal, current will not flow in the springs (pressuring fixtures) 236. Accordingly, the current path component terminals 226→contact 225→springs (pressuring fixtures) 236→connection pressuring part 232 does not arise.

The embodiment of FIG. 12A is configured to isolate with the insulating plate 312. The isolating effect in the present invention is not limited to the configuration using the insulating plate 312 as illustrated in FIG. 12A. For example, the configuration illustrated in FIG. 12D is exemplarily illustrative.

FIG. 12D illustrates a configuration in which an insulating part 315 made of a synthetic resin material or the like is arranged on the periphery of threaded hole 238b in the connection pressuring part 232. Because the periphery of the threaded hole 238b is insulated by the insulating part 315, current does not flow in the fixing screws 224b. Accordingly, a component terminal 226→contact 225→springs (pressuring fixtures) 236→connection pressuring part 232 current path does not arise, such that the springs (pressuring fixtures) 236 are not subjected to burnout. As described above, the present invention is constituted with the insulating plate 312 is arranged on the spring 236 side, where pressing force is applied, so that current does not flow to the presser mounting plate 313 and the contact 225 side.

Electric current flowing would flow to the pressing components including the springs 236, and to the fixing screw 224b, wherein the springs 236 and the fixing screw 224b would undergo burnout. A test current is supplied to the component terminals 226 via the connection-retaining-part 233 side, where the springs 236 and other high-resistance areas are few.

Figure 17:
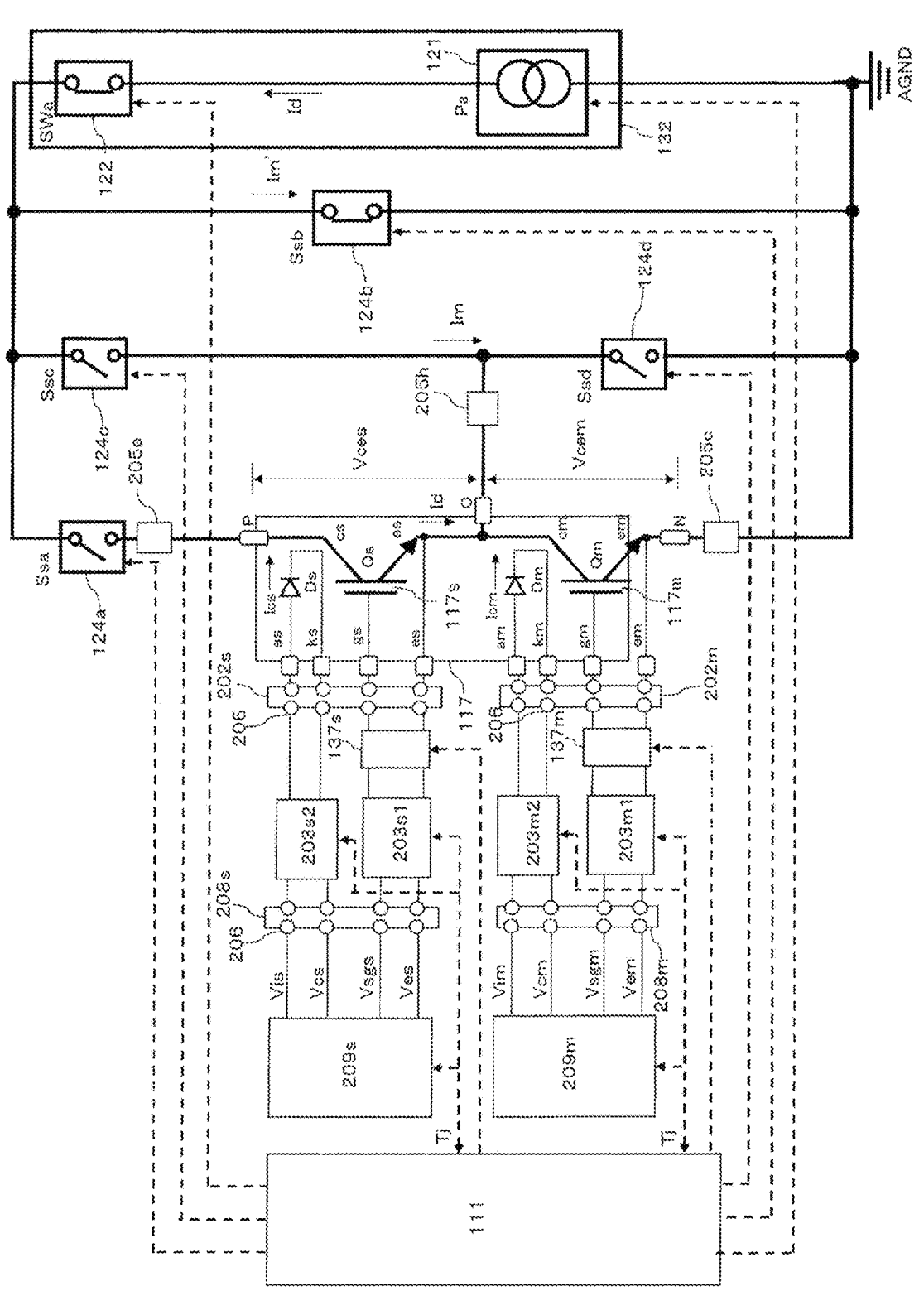
FIG. 17 is an explanatory diagram and block diagram of a semiconductor-component test device of the present invention.
Figure 18:
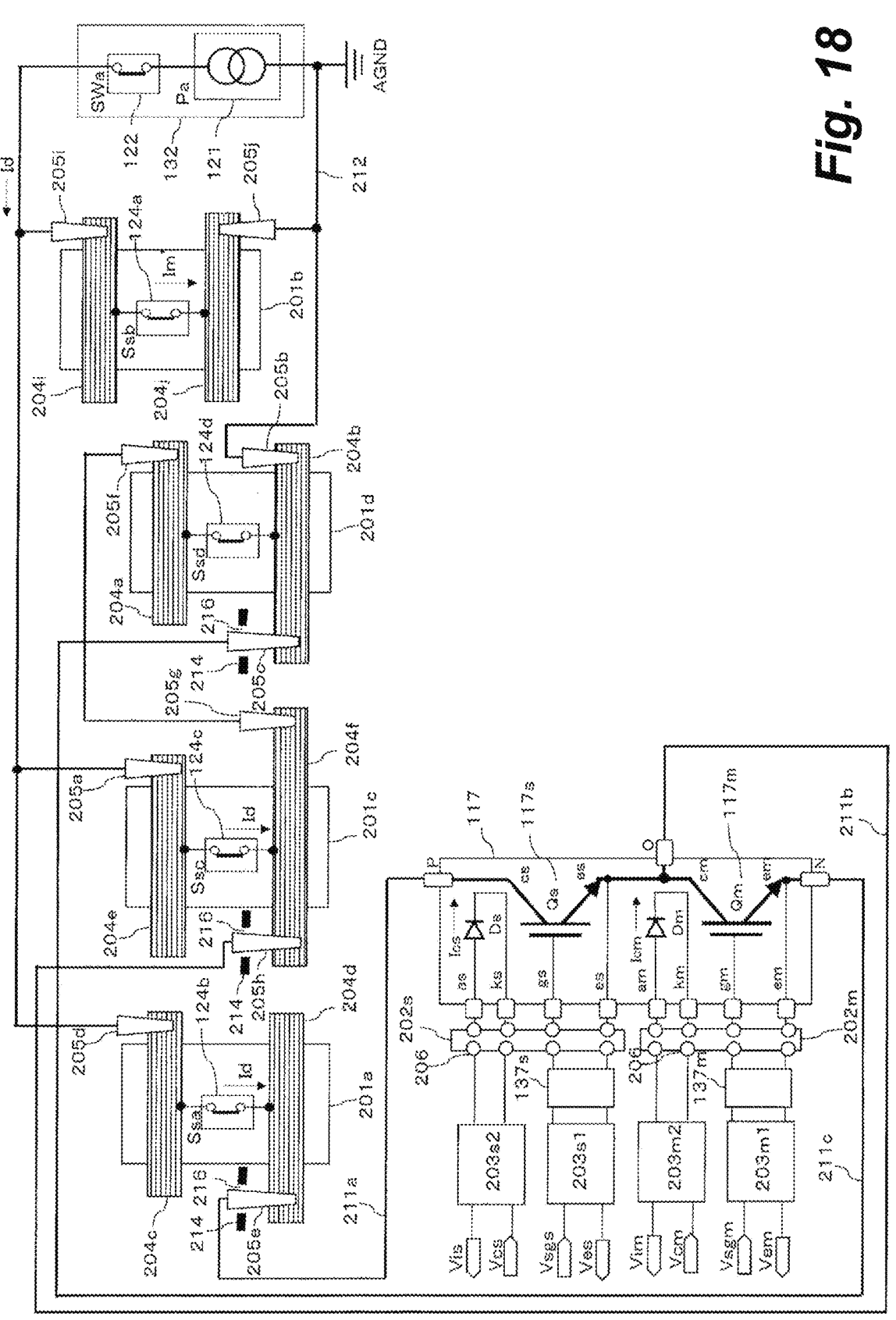
FIG. 18 is an explanatory diagram and configurational diagram of a semiconductor-component test device of the present invention.

FIG. 17 is an equivalent-circuit diagram and an explanatory diagram of the semiconductor-component test device in the first embodiment of the present invention. FIG. 3D exemplarily illustrate the semiconductor module under test, but it is not limited thereto.

In FIG. 17, by the switch circuit 124b being switched on, the output of the power supply 132 is short-circuited, making the current Id output by the power supply 132 flow to ground as the current Im'. Otherwise, by the switch circuit 124b being switched on, the electric charge from charging across the terminals of the power supply 132 is discharged.

Meanwhile, by the switch circuit 124c and the switch circuit 124d being switched on at the same time, the current Im flows and the output of the power supply 132 is short-circuited, discharging electric charge in the power supply 132. In implementations of this configuration or method, the switch circuit 124b is unnecessary.

It is also effective to shift the timing at which the switch circuit 124c and the switch circuit 124d are switched on. For example, by the switch circuit 124c being switched on ahead of the switch circuit 124d, the transistor 117s is short-circuited across its channel.

Next, by the switch circuit 124d being switched on, the channels of the transistor 117m are short-circuited. Otherwise, by the switch circuit 124d being switched on ahead of the switch circuit 124c, the channel of the transistor 117m is short-circuited. Next, by the switch circuit 124c being switched on, the channel of the transistors 117s is short-circuited. As described above, by switching on the switch circuits 124 in order, the generation of surge voltages, arising in the semiconductor components 117, can be further suppressed. By the switch circuit 124a being switched on, the current Id output by the power supply 132 is supplied to the transistor 117. The fork plugs 205 are inserted through the openings 216 in the partitioning wall 214 and are electrically connected to the switch circuit board 201.

Figure 20:
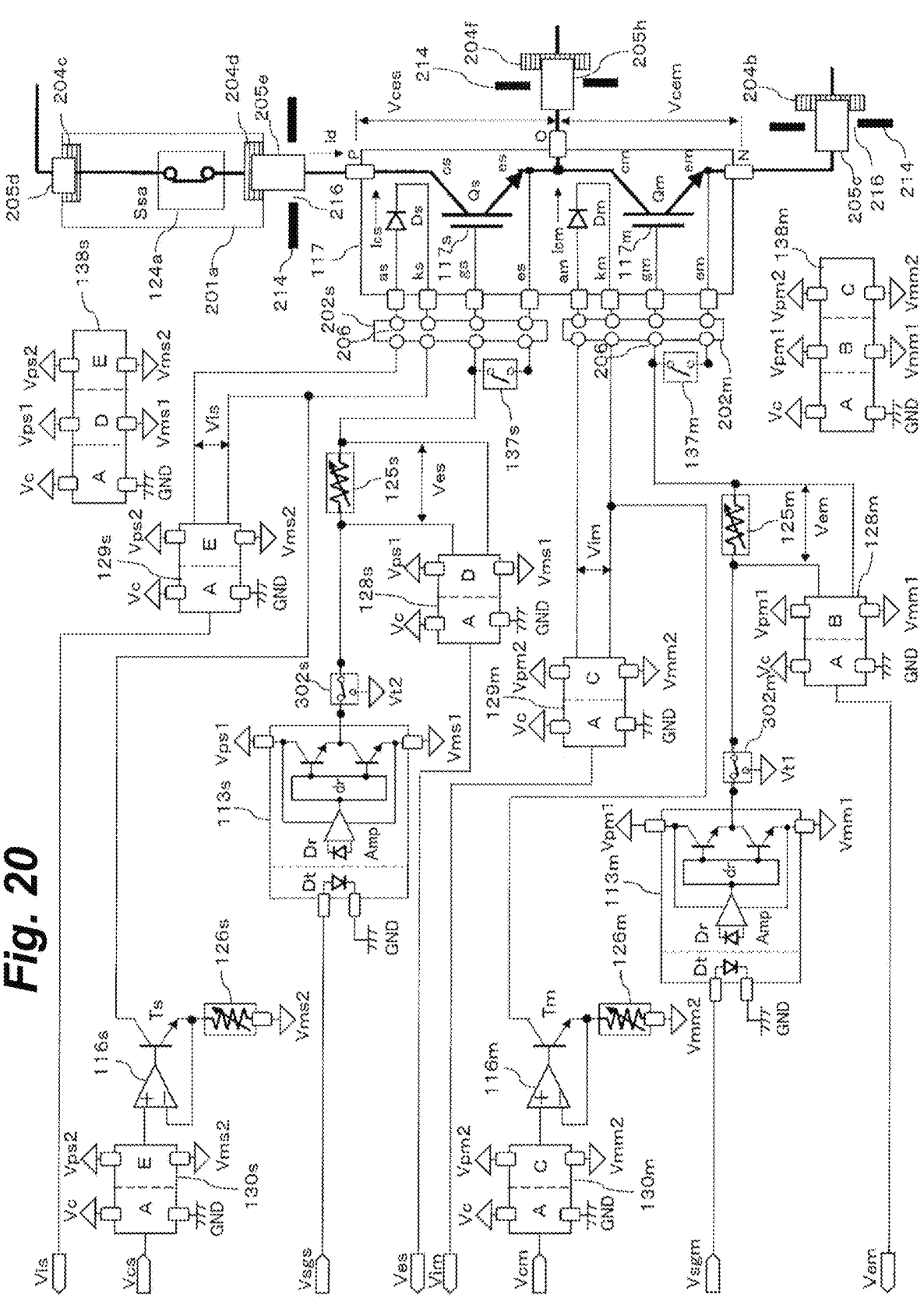
FIG. 20 is an explanatory diagram of electrical circuit sections of a semiconductor-component test device of the present invention.
Figure 21:
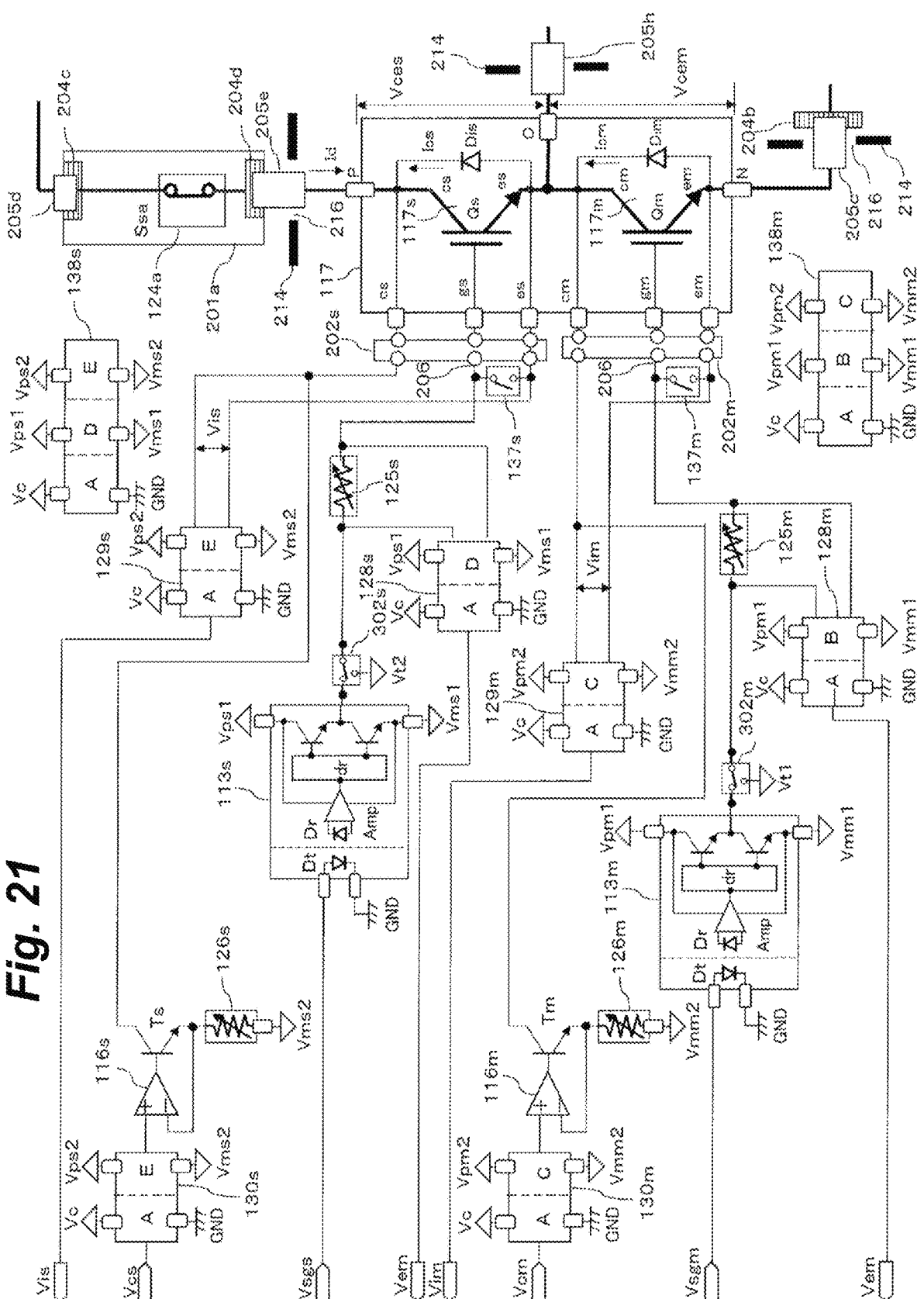
FIG. 21 is an explanatory diagram of electrical circuit sections of a semiconductor-component test device of the present invention.

FIG. 20 and FIG. 21 are explanatory diagrams of electrical circuit sections of a semiconductor test device of the present invention, and explanatory diagrams of circuit operation. As illustrated in FIGS. 20 and 21, the semiconductor-component test device of the present invention has an isolated DC-to-DC converter circuit 138m and an isolated DC-to-DC converter circuit 138s.

FIG. 20 exemplarily illustrates FIGS. 3D and 3E as semiconductor modules being tested. FIG. 21 exemplarily illustrates FIGS. 3C and 3C as semiconductor modules being tested. It will be appreciated that electrical component test devices and electrical component testing methods of the present invention can be applied to other than what is exemplarily illustrated in FIG. 3A1 through 3E2.

The isolated DC-to-DC converter circuit 138m generates from the input voltage (Vc voltage that is the circuit voltage) two voltages (a Vpm1 voltage with the Vmm1 potential being the reference, and a Vpm2 voltage with the Vmm2 potential being the reference). GND, the Vmm1 voltage, and the Vmm2 voltage are isolated. Likewise, GND, the Vpm1 voltage, and the Vpm2 voltage are isolated.

The isolated DC-to-DC converter circuit 138s generates from the input voltage (the Vc voltage) two voltages (a Vps1 voltage with the Vms1 potential being the reference, and a Vps2 voltage with the Vms2 potential being the reference). GND, the Vms1 voltage, and the Vms2 voltage are isolated. Likewise, GND, the Vps1 voltage, and the Vps2 voltage are isolated.

The ground voltage may be considered to be the reference voltage for the Vmm1 voltage, the Vmm2 voltage, the Vms1 voltage, and the Vms2 voltage. However, this ground voltage is isolated from each of the voltages. The Vmm1 voltage and the Vmm2 voltage may, following when the voltages are generated, have a common potential, without being isolated. The Vms1 voltage and the Vms2 voltage may, following when the voltages are generated, have a common potential, without being isolated.

If necessary, an isolated DC-to-DC converter circuit that generates Vt1 voltage and Vt2 voltage is put into place. The Vt1 voltage and the Vt2 voltage are isolated from the Vc voltage. The Vt1 voltage is a potential in the negative direction with respect to the Vmm1 voltage. The Vt2 voltage is a potential in the negative direction with reference to the Vms1 voltage.

The Vt1 voltage may be generated with the Vmm1 voltage or the Vmm2 voltage as the reference. The Vt2 voltage may be generated with the Vms1 voltage or the Vms2 voltage as the reference.

The Vt1 voltage and the Vmm1 voltage can be selected and applied to the gate terminal gm of the transistor 117*m*. The Vt2 voltage and the Vms1 voltage are selected so that they can be applied to the gate terminal gs of the transistor 117*s* (Qs). The voltage selection circuit 302 utilizes an analog switch or the like.

The potential difference between the Vmm1 voltage and the Vpm1 voltage of the isolated DC-to-DC converter circuit 138*m* is set to be the on-voltage Vg applied to the gate terminal gm of the transistor 117*m* (Qm). An isolated DC-to-DC converter circuit 138*m* is situated so that the on-voltage Vg can be changed.

The potential difference between the Vms1 voltage and the Vps1 voltage of the isolated DC-to-DC converter circuit 138*s* is set to be the on-voltage Vg applied to the gate terminal gs of the transistor 117*s* (Qs). An isolated DC-to-DC converter circuit 138*s* is situated so that the on-voltage Vg can be changed.

The A block, B block, and C block of the isolated DC-to-DC converter circuit 138*m* illustrated in FIGS. 20 and 21 are isolated. Likewise, the A block, D block, and E block of the isolated DC-to-DC converter circuit 138*s* are isolated.

Electric power is transferred between the A block and the B block, between the A block and the C block, between the A block and the D block, and between the A block and the E block by using a coil or the like. Also, the control signals between blocks are transmitted and received using a phototransistor or the like to isolate the signals.

The circuit ground (GND), the Vc voltage, the Vpm1 voltage, the Vmm1 voltage, the Vpm2 voltage, and the Vmm2 voltage are in an isolated state. That is, each voltage is in a floating state with respect to the other voltages. "Floating" is a state of not being electrically connected with respect to other voltages or potentials—a state in which the voltage or potential is independent. With the present invention, signal potentials applied to gate terminals are generated and used in a floating state. Therefore, they are insusceptible to noise.

Let the voltage generated by the isolated DC-to-DC converter circuit 138 be floating. Let Vm1 be the potential difference between the Vmm1 voltage and the Vpm1 voltage, and Vm2 be the potential difference between the Vmm2 voltage and the Vpm2 voltage.

Then when, for example, the Vmm1 voltage is connected to the circuit ground (GND) and the Vpm1 voltage is short-circuited with the Vmm2 voltage, the Vpm2 voltage will be the voltage obtained by adding the Vm2 voltage to the Vm1 voltage with respect to the circuit ground (GND). That is, the potential made floating is determined by establishing the potential with another voltage. The potential level can be altered, shifted, and set corresponding to the potential of another voltage.

With a semiconductor-component test device of the present invention, the circuit ground (GND) and other power supply voltages are isolated. Furthermore, the device is configured to enable wired-linking or connecting the isolated power supply voltages. For example, the Vmm1 voltage and the Vmm2 voltage can be wire-linked to make them have the same potential. The Vms1 voltage and the Vms2 voltage can be wire-linked to make them have the same potential.

As illustrated in FIG. 17, the sample connection circuit 203*m*1 adjusts or sets the gate driver circuit 113*m* that generates the gate signal waveform applied to the gate terminal gm of the transistor 117*m* (Qm), and the rising and falling waveforms of the gate signal. It has, inter alia, a variable resistor circuit 125*m*, a shorting circuit 137*m*, and a voltage selection circuit 302*m*.

The sample connection circuit 203*m*2 includes a constant-current setting circuit 130*m* that generates a constant current Icm applied to the diode Dm of the transistor 117*m*, and a voltage-detection circuit 129*m* that measures or detects the terminal voltage of the diode Dm.

The sample connection circuit 203*s*1 includes, inter alia, a gate driver circuit 113*s* that generates a gate signal waveform applied to the gate terminal gs of the transistor 117*s*, a variable resistor circuit 125*s* that adjusts or sets the rising and falling waveforms of the gate signal, a shorting circuit 137*s*, a voltage selection 302*s*.

The sample connection circuit 203*s*2 includes a constant-current setting circuit 130*s* that generates a constant current Ics applied to the diode Ds of the transistor 117*s*, and a voltage-detection circuit 129*s* that measures or detects the terminal voltage of the diode Ds. Hereinafter, unless otherwise specified, the N electrode terminal of the semiconductor component 117 will be described as a reference potential (AGND, 0 (V)).

When the N electrode terminal of the semiconductor component 117 is used as a reference potential, the potential at the emitter terminal es of the transistor 117*s* is the voltage Vcem across the channel of the transistor 117*m*. That is, it turns out to be the potential at the O electrode terminal of the semiconductor component 117.

The potential at the P electrode terminal of the semiconductor component 117 is the sum of the voltage Vcem across the channel of the transistor 117*m* and the voltage Vces across the channel of the transistor 117*s*. The potential at the O electrode terminal and the potential at the P electrode terminal fluctuate depending on the magnitude of the current Id flowing in the transistor 117*m* and the transistor 117*s*, and the on/off state of the transistor 117*m* and the transistor 117*s*. In particular, the fluctuation in potential at the emitter terminal es of the transistor 117*s* is large.

It is preferable that Vms1, which is the potential at the emitter terminal es of the transistor 117*s*, can be changed according to the fluctuation of the channel voltage Vcem of the transistor 117*m*.

In the present invention, Vmm1, which is the potential at the emitter terminal em of the transistor 117*m*, is floating with respect to Vms1, which is the potential at the emitter terminal es of the transistor 117*s*. Therefore, when the channel voltage Vcem of the transistor 117*m* fluctuates, the Vces voltage also fluctuates in the same direction and at the same potential.

The power-supply potential of the diode Dm on the transistor 117*m* has as its reference the potential at the emitter terminal em of the transistor 117*m*. The diode Ds of the transistor 117*s* has as its reference the potential at the emitter terminal es of the transistor 117*s*.

In the present invention, the Vc voltage, Vms1 voltage/Vps1 voltage, and Vms2 voltage/Vps2 voltage of the isolated DC-to-DC converter circuit 138*s* are isolated. The Vc voltage, Vmm1 voltage/Vpm1 voltage, and Vmm2 voltage/Vpm2 voltage of the isolated DC-to-DC converter circuit 138*m* are isolated. The respective voltages are constituted so that they can be wired or connected to any voltage of choice.

Figure 22:
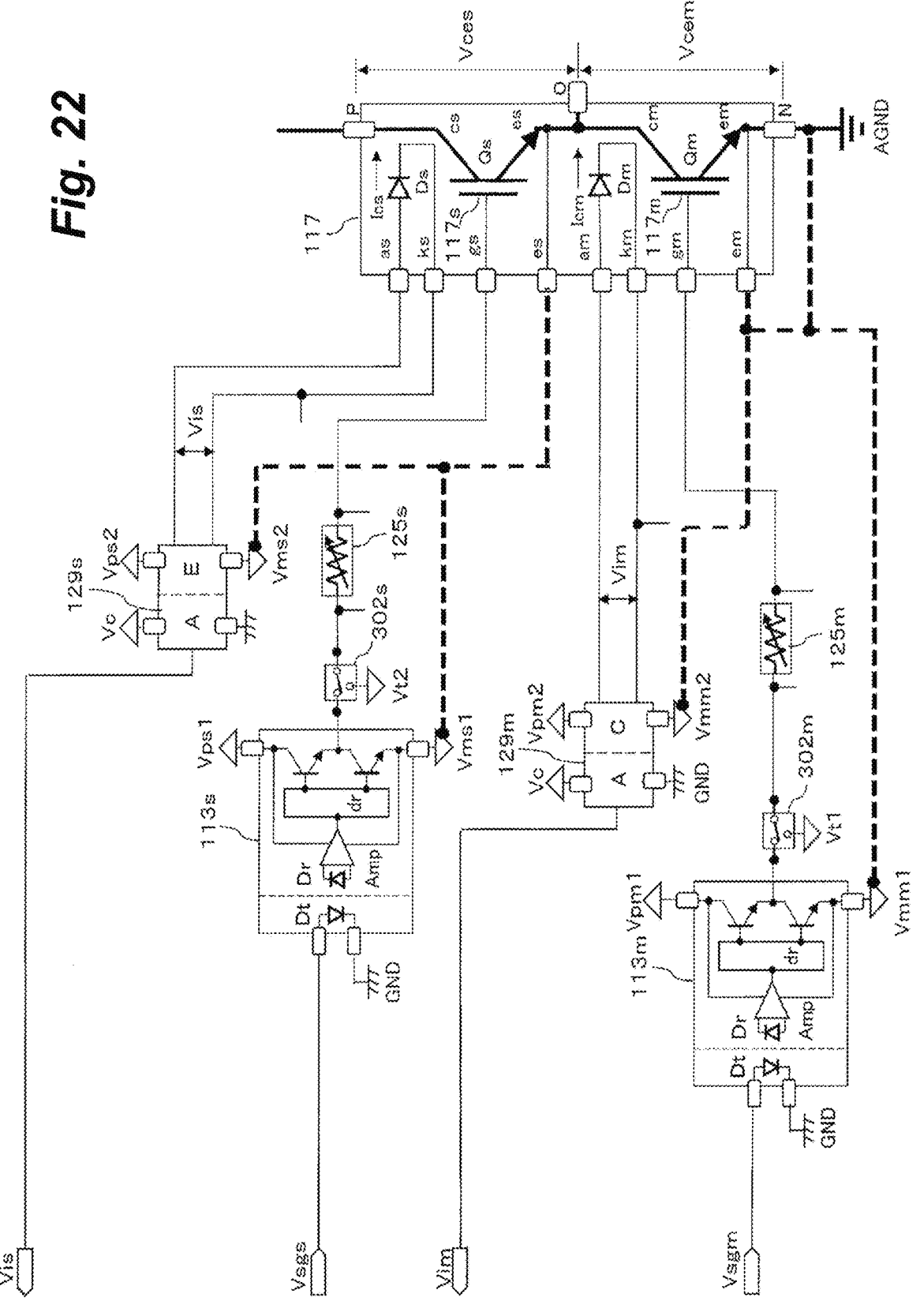
FIG. 22 is an explanatory diagram for a semiconductor-component test method of the present invention.

FIG. 22 is an explanatory diagram illustrating wired links in a power supply system of the semiconductor-component test device of the present invention. The N electrode terminal of the transistor 117 is connected to AGND. AGND is, for example, the earth potential.

As illustrated in FIGS. 22, 23, 24, and 25, the present invention enables connection-altering the wired links as desired. What is more, the connection wiring and the applied voltages can be altered by means of a switch circuit 123 and a selector 127.

The emitter terminal em and the N electrode terminal of the transistor 117*m* are electrically connected, and the emitter terminal em and the Vmm1 terminal are connected. Also, the emitter terminal em and the Vmm2 terminal are connected. The emitter terminal es of the transistor 117*s* and the Vms1 terminal are connected. Also, the emitter terminal es and the Vms2 terminal are connected.

The potential at the emitter terminal es of the transistor 117*s* is a voltage obtained by adding the channel voltage Vcem of the transistor 117*m* to the potential at the N electrode terminal. Therefore, the potential at the emitter terminal es of the transistor 117*s* changes depending on the on/off state of the transistor 117*m* and the magnitude of the constant current Id.

For the gate signal Vsg applied to the gate terminal gm of the transistor 117 *m*, the reference is the potential at the emitter terminal em. Assuming that the voltage for switching on the transistor 117*m* is Vg, when the Vg voltage from the AGND potential at the N electrode terminal is applied, the transistor 117*m* is switched on.

Figure 19:
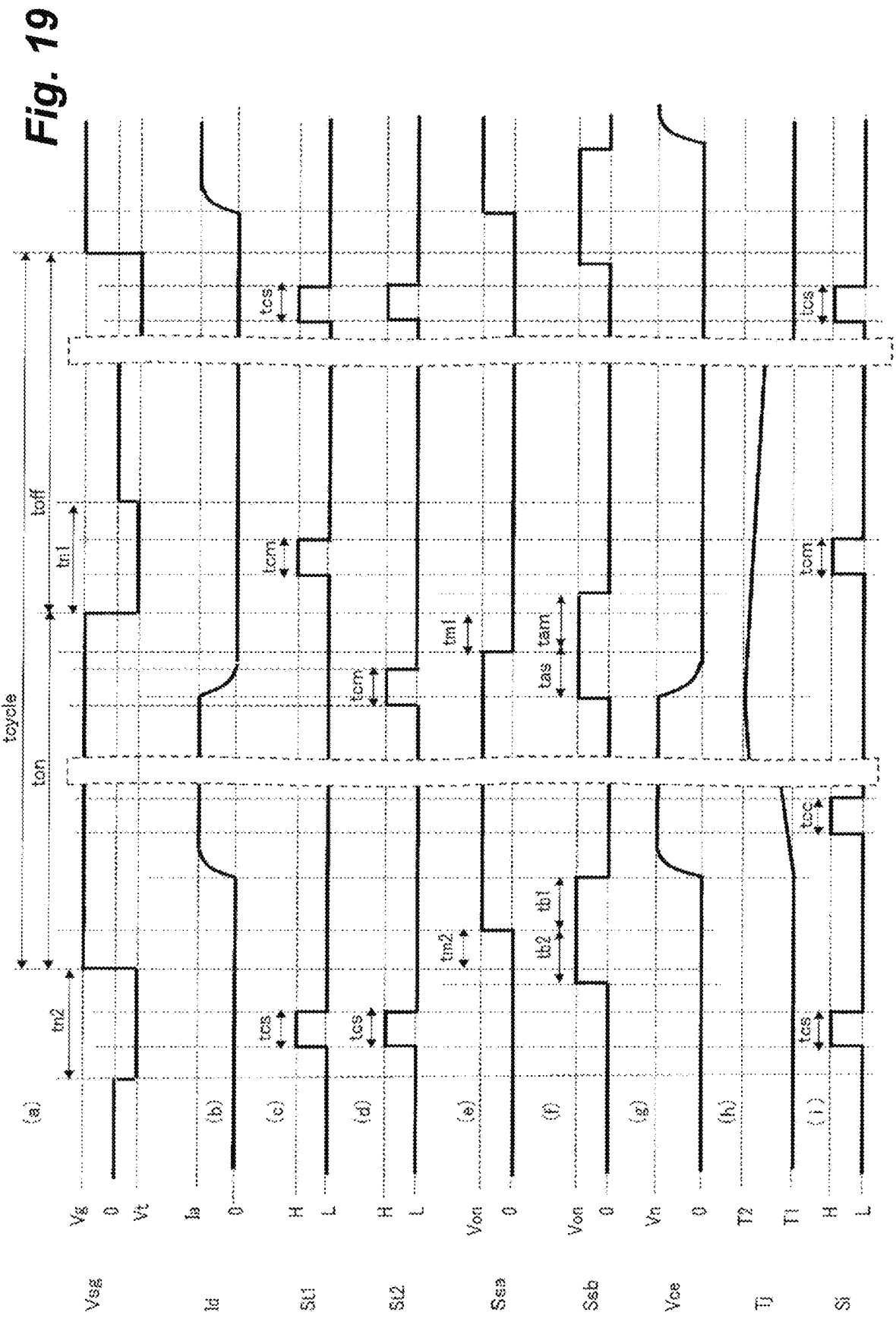
FIG. 19 is timing-chart diagrams for a semiconductor-component test method of the present invention.

FIG. 19 is a series of timing-chart diagrams (a) through (i) illustrating the operation of the electrical circuit sections of a semiconductor test device of the present invention. The Vt voltage applied in the tn2 period and the tn1 period in chart (a) in FIG. 19 is set according to the semiconductor component 117 being tested. As illustrated in charts (b), (c) and (i) in FIG. 19, the periods during which the constant current Id is not flowing are tcs, the period before the constant current Id flows, and tcm, the period after the constant current Id has flowed, in the transistor 117; the period during which the constant current Id is flowing is tcc. The switch Si is turned on during at least one or more of the periods tcs, tcm, and tcc, and the voltage Ve at the two terminals of the variable resistor circuit 125 is measured.

St2 in chart (d) in FIG. 19 is a timing signal for passing a current Ic through the diodes D (diode Ds, diode Dm), and when St2 is at H level, current flows through the diodes D on the transistors 117. The voltage-detection circuits 129 acquire the voltages across the terminals of the diodes D, and the temperature measuring circuit converts the voltage across the terminals into the temperature information Tj. The temperature information Tj is sent to the control circuit board 111 (controller 111). St1 and St2 are times for passing a measurement current through the temperature measurement diode, or times for temperature measurement.

Vce in chart (g) in FIG. 19 is the channel voltage of the transistors 117 (transistor 117*m*, transistor 117*s*), and the temperature information Tj indicates the temperature change of the measured transistors 117 (transistor 117*m*, transistor 117*s*).

In chart (a) in FIG. 19 the 0 (V) potential is a voltage that switches off the transistor 117*m*. In chart (a) and elsewhere in FIG. 19, the Vt1 voltage is illustrated as a Vt voltage. The Vt1 voltage is a voltage that is more negative than the 0 (V) potential. A negative Vt1 voltage is applied as a reference to the Vmm1 voltage.

The current Icm flowing through the diode Dm generates a Vmm2 voltage and a Vpm2 voltage as power sources. Since the Vmm2 voltage is shared with the Vmm1 voltage, the voltage at the terminals of the diode Dm is in the range of Vmm1 and Vpm2, and is a voltage with reference to AGND.

The potential at the emitter terminal es is used as a reference for the gate signal Vsg applied to the gate terminal gs of the transistor 117*s*. The potential at the emitter terminal es is a voltage obtained by adding the channel voltage Vcem of the transistor 117*m* to the AGND potential at the N electrode terminal.

As illustrated in chart (a) in FIG. 19, assuming that the voltage for switching on the transistor 117*s* is Vg, then the voltage at which the transistor 117*s* goes on will be, with the reference being a voltage that is the voltage Vcem across the channel of the transistor 117*m* added to the AGND potential at the N electrode terminal, when the Vg voltage has been applied, the state in which the transistor 117*s* is on.

The Vms1 voltage is insulated from the Vmm1 voltage and is in a floating state. Therefore, even if the channel-length voltage Vcem of the transistor 117*m* fluctuates, the es potential at the transistor 117*s* emitter terminal fluctuates according to the fluctuation of the channel voltage Vcem of the transistor 117*m*. The Vms1 voltage generates a Vps1 voltage with the emitter terminal es potential being the reference.

The potential at the emitter terminal es serves as the reference for the gate signal Vsg applied to the gate terminal gs of the transistor 117*s*. As illustrated in chart (a) in FIG. 19, assuming that the voltage for switching on the transistor 117*s* is Vg, then the transistor 117*s* will be in the on state when from the emitter terminal es potential, the Vg voltage is applied.

In addition, in chart (a) and elsewhere in FIG. 19, the Vt2 voltage is illustrated as a Vt voltage. The Vt2 voltage is a voltage that is more negative than the 0 (V) potential. The Vms1 voltage and, as a reference, a negative-side Vt2 voltage are applied.

The current Ics flowing in the diode Ds generates a Vms2 voltage and a Vps2 voltage as power sources. Since the Vms2 voltage is shared with the Vms1 voltage, the voltage at the terminals of the diode Ds is in the range of Vms1 and Vps2.

The Vms1 voltage is isolated from the Vmm1 voltage and is in a floating state. Further, the Vms1 voltage is connected to the collector terminal cm of the transistor 117*m*. Therefore, even if the channel voltage Vcem of the transistor 117*m* fluctuates, the voltage (Vg) for switching on the transistor 117*s* and the voltage (0 (V)) for switching it off do not fluctuate. Therefore, the transistor 117*s* can be ideally on/off controlled.

Figure 23:
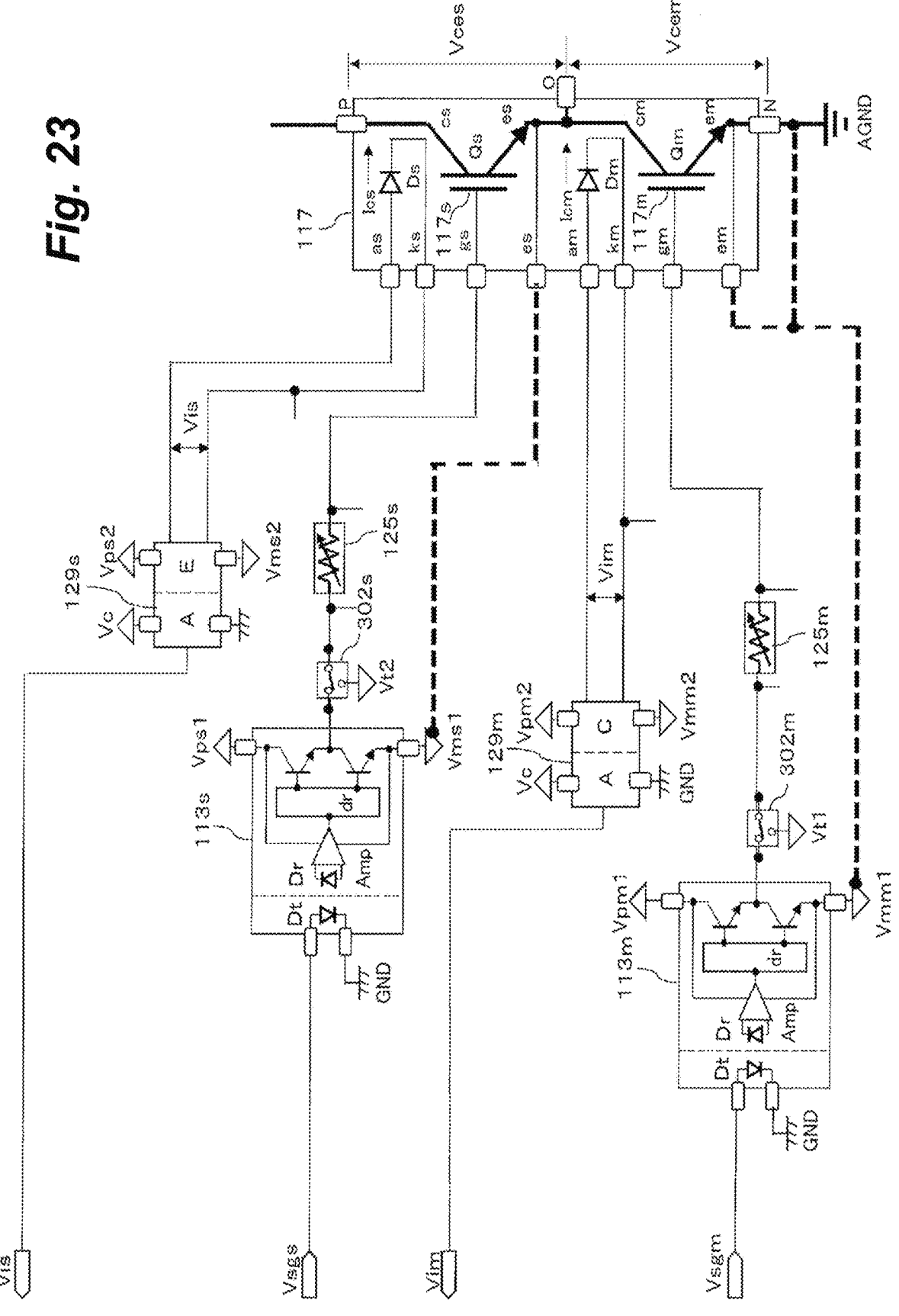
FIG. 23 is an explanatory diagram for a semiconductor-component test method of the present invention.

FIG. 23 is an explanatory diagram illustrating wired links in the power supply system in another semiconductor-component test device of the present invention. By the wired links of FIG. 23, the N electrode terminal of the transistors 117 is connected to AGND. AGND is, for example, earth potential.

The emitter terminal em and the N electrode terminal of the transistor 117*m* are electrically connected, and the emitter terminal em and the Vmm1 terminal are connected. The emitter terminal es of the transistor 117*s* and the Vms1 terminal are connected. The Vmm2 terminal and Vms2 terminal, isolated from the other power supply terminals, are in a floating state.

The current Icm flowing in the diode Dm generates a Vmm2 voltage and a Vpm2 voltage as power sources. The voltage at the terminals of the diode Dm is basically in the range of Vmm2 and Vpm2.

The current Ics flowing in the diode Ds generates a Vms2 voltage and a Vps2 voltage as power sources. The terminal voltage of the diode Ds is basically in the range of Vms2 and Vps2.

The Vmm2 terminal potential is held at a potential whose reference is AGND, while the Vms2 terminal potential is held at a potential whose reference is the potential at the emitter terminal es of the transistor 117s.

Figure 24:
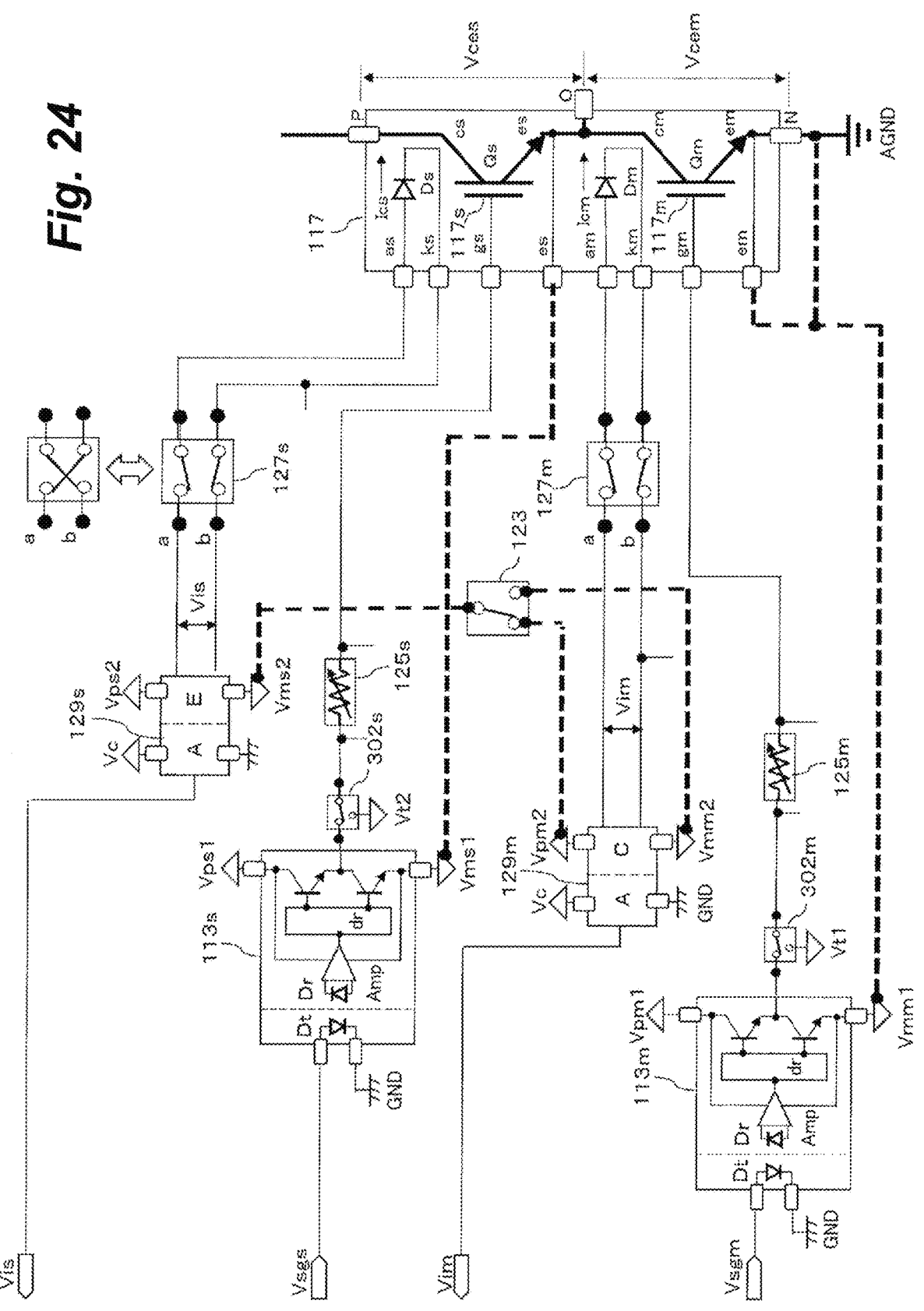
FIG. 24 is an explanatory diagram for a semiconductor-component test method of the present invention.

FIG. 24 is an explanatory diagram illustrating wired links in the power supply system in another semiconductor-component test device of the present invention. By the wired links of FIG. 24, the N electrode terminal of the transistors 117 is connected to AGND.

The emitter terminal em and the N electrode terminal of the transistor 117m are electrically connected, and the emitter terminal em and the Vmm1 terminal are connected. Further, the Vmm2 terminal and the Vms2 terminal are connected. The emitter terminal es of the transistor 117s and the Vms1 terminal are connected. The Vmm1 terminal and the Vmm2 terminal are not connected.

Current Icm flowing in the diode Dm generates a Vmm2 voltage and a Vpm2 voltage as power sources. The voltage at the terminals of the diode Dm is basically in the range of Vmm2 and Vpm2. Current Ics flowing in the diode Ds generates a Vms2 voltage and a Vps2 voltage as power sources. The terminal voltage of the diode Ds is basically in the range of Vms2 and Vps2. Since the Vmm2 voltage and the Vms2 voltage are shared, the potential of the diode Dm and the potential of the diode Ds operate within the common potential.

In FIG. 24, the switch circuit 123 is situated midway in the power-supply lines. The switch circuit 123 can switch between connecting the Vms2 voltage and the Vpm2 voltage or connecting the Vms2 voltage and the Vmm2 voltage.

By situating or providing the switch circuit 123 as illustrated in FIG. 24, a diverse variety of tests may be supported. Examples of the switch circuit 123 include analog switches, relay circuits, and magnet switches.

The switch circuit 123 is not limited to the embodiment illustrated in FIG. 24. For example, it may be configured to select the Vmm1 and Vpm1 voltages and connect them with another potential (e.g., connect with the Vmm1 voltage). As given in the foregoing, the present invention is characterized in being configured so that the wired-link state of the potential generated by the isolated DC-to-DC converter circuits may be altered.

Figure 25:
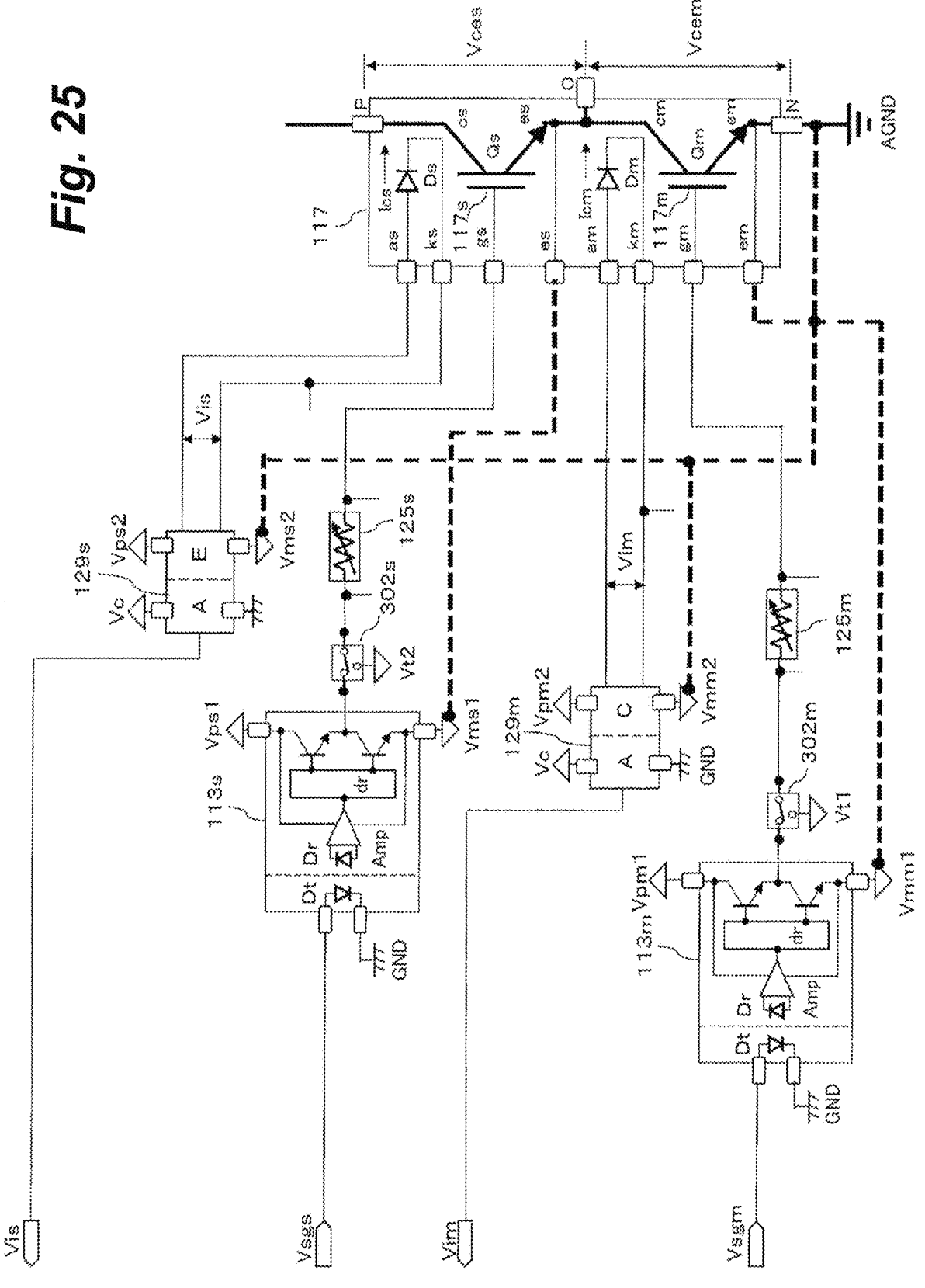
FIG. 25 is an explanatory diagram for a semiconductor-component test method of the present invention.

FIG. 25 is an explanatory diagram illustrating wired links in the power supply system in another semiconductor-component test device of the present invention. By the wired links of FIG. 25, the N electrode terminal of the transistors 117 is connected to AGND.

The emitter terminal em and the N electrode terminal of the transistor 117m are electrically connected, and the emitter terminal em and the Vmm1 terminal are connected. The Vmm1 terminal and the Vmm2 terminal are connected, and the Vmm1 terminal and the Vms1 terminal are connected. The emitter terminal es of the transistor 117s and the Vms1 terminal are connected.

The Vmm2 terminal and the Vms2 terminal are connected. Current Icm flowing in the diode Dm generates a Vmm2 voltage and a Vpm2 voltage as power sources. The voltage at the terminals of the diode Dm is basically in the range of Vmm2 and Vpm2.

Current Ics flowing in the diode Ds generates a Vmm2 voltage and a Vps2 voltage as power sources. The terminal voltage of the diode Ds is basically in the range of Vmm2 and Vps2. Since the Vmm2 voltage and the Vms2 voltage are shared, the potential of the diode Dm and the potential of the diode Ds operate within the common potential. The potential of the Vmm1 voltage changing shifts the potential of the Vpm1 voltage also. The potential of the Vmm2 voltage changing shifts the potential of the Vpm2 voltage also. The potential of the Vms1 voltage changing cooperatively shifts the potential of the Vps1 voltage also. The potential of the Vms2 voltage changing cooperatively shifts the potential of the Vps2 voltage also.

The Vmm1 voltage and the Vms1 voltage are floating. Therefore, when the voltage Vcem across the transistor 117m channel changes, Vms1 changes cooperatively with the change in Vcem.

The gate signal (on/off signal) applied to the gate terminal gm of the transistor 117m is output with the Vmm1 voltage as the reference. The gate signal (on/off signal) applied to the gate terminal gs of the transistor 117s is output with the Vms1 voltage as the reference.

When the current Id flowing in the transistor 117m changes and the applied voltage on the gate terminal gm of the transistor 117m changes, even if the channel voltage Vcem of the transistor 117m changes, the Vms1 voltage, because it is floating, changes cooperatively with the Vcem voltage.

Even if the channel voltage Vce of the transistor 117m changes, because the Vms1 voltage is floating and the gate signal of the transistor 117s is generated with the Vms1 voltage as the reference, the transistor 117s can be on/off controlled without any problem.

With the diode Ds, the Vmm1 voltage and the Vms1 voltage are floating. Therefore, even if the Vmm1 voltage changes or even if the voltage Vcem across the transistor 117m channel changes, the temperature of the transistor 117s can be measured without breaking down.

FIG. 26A to 26F are explanatory diagrams of testing methods in, as well as test states of, a semiconductor-component test device and semiconductor component parts of the present invention. The semiconductor components 117 are tested by sequentially implementing or randomly implementing any of the states or methods illustrated in FIGS. 26A to 26F.

Figures 26A, 26B, 26C, 26D, 26E, 26F:
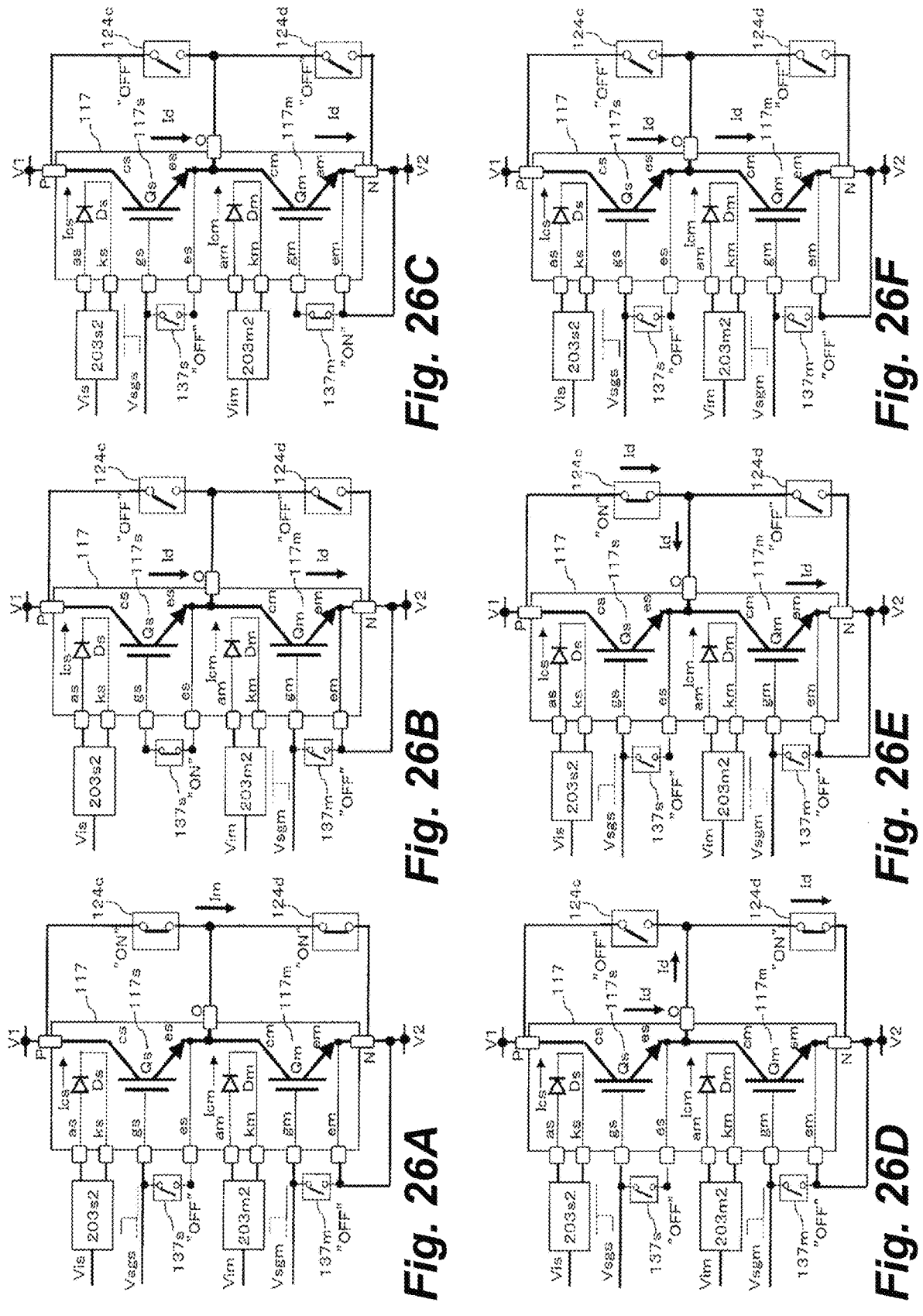
FIG. 26A to 26F are explanatory diagrams for a semiconductor-component test method of the present invention.

FIG. 26A is an explanatory diagram of a method (state) of short-circuiting the terminals of the transistors 117 (between the P electrode terminal and the N electrode terminal) to discharge the electric charge so that surge voltages and transient currents do not flow in the transistor 117.

An off voltage is applied to the gate terminal gm of the transistor 117m as a gate signal Vsgm, and the transistor 117m is switched off. An off voltage is applied to the gate terminal gs of the transistor 117s as a gate signal Vsgs, and the transistor 117s is switched off. The shorting circuit 137s and the shorting circuit 137m are switched off (open). The switch circuit 124c and the switch circuit 124d are switched on (closed).

FIG. 26B represents a state in which the shorting circuit 137s is switched on, putting the transistor 117s in a diode-connected state, and the transistor 117m is switched on, whereby a constant current Id flows in the semiconductor component 117 and the semiconductor component 117 is under test.

An on-voltage or an off-voltage is periodically or intermittently applied to the gate terminal gm of the transistor 117m as a gate signal Vsgm, and the transistor 117m is controlled into an on-state or an off-state.

The shorting circuit 137s connected between the gate terminal gs and the emitter terminal es of the transistor 117s is switched on, and the transistor 117s is put into a diode-connected state. The switch circuit 124c and the switch circuit 124d are switched off (open).

A constant current Id flows between the P electrode terminal and the N electrode terminal in the semiconductor component 117. The semiconductor component 117 is tested by controlling the transistor 117*m* on and off by means of the gate signal Vsgm applied to the gate terminal gm of the transistor 117*m*.

FIG. 26C represents a state in which the transistor 117*m* is put into a diode-connected state, and the transistor 117*s* is switched on, whereby a constant current Id is flows in the semiconductor component 117 and the semiconductor component 117 is under test.

An on-voltage or an off-voltage is periodically or intermittently applied to the gate terminal gs of the transistor 117*s* as a gate signal Vsgs, and the transistor 117*s* is controlled into an on-state or an off-state.

The shorting circuit 137*m* connected between the gate terminal gm of the transistor 117*m* and the emitter terminal em is switched on, and the transistor 117*m* is put into the diode-connected state. The switch circuit 124*c* and the switch circuit 124*d* are switched off (open). A constant current Id flows between the P electrode terminal and the N electrode terminal in the semiconductor components 117. The semiconductor components 117 are tested by controlling the transistor 117*s* on and off by means of the gate signal Vsgs applied to the gate terminal gs of the transistor 117*s*.

In FIG. 26D, the transistor 117*s* is switched on and the transistor 117*m* is switched off. An on-voltage or an off-voltage is periodically or intermittently applied to the gate terminal gs of the transistor 117*s* as a gate signal Vsgs. The transistor 117*m* is controlled into the off state.

The shorting circuit 137 connected between the gate terminal g and the emitter terminal e of the transistor 117*m* and the transistor 117*s* is switched off (open). The switch circuit 124*c* is switched off and the switch circuit 124*d* is switched on (closed).

A current Id flows in the semiconductor components 117 from the P electrode terminal to the channel of the transistor 117*s*, and the current Id flows through the switch circuit 124*d*. The semiconductor component 117 is tested by controlling the transistor 117*s* on and off by means of the gate signal Vsgs applied to the gate terminal gs of the transistor 117*s*.

In FIG. 26E, the transistor 117*m* is switched on and the transistor 117*s* is switched off. An on-voltage or an off-voltage is periodically or intermittently applied to the gate terminal gm of the transistor 117 *m* as a gate signal Vs gm. The transistor 117*s* is controlled into the off state.

The shorting circuit 137 connected between the gate terminal g and the emitter terminal e of the transistor 117*m* and the transistor 117*s* is switched off (open). The switch circuit 124*d* is switched off (open) and the switch circuit 124*d* is switched on (closed).

In the semiconductor components 117, the current Id flows from the P electrode terminal to the switch circuit 124*c*, and current Id flows across the channel of the transistor 117*m*. The semiconductor component 117 is tested by controlling the transistor 117*m* on and off by means of the gate signal Vsgm applied to the gate terminal gm of the transistor 117*m*.

FIG. 26F represents a state in which a gate signal is applied to the gate terminals g (gate terminal gm, gate terminal gs) of the transistor 117*m* and the transistor 117 *s*, whereby a constant current Id flows in the semiconductor components 117 and the semiconductor components 117 are under test.

An on-voltage or an off-voltage is periodically or intermittently applied to the gate terminal gs of the transistor

117*s* and the gate terminal gm of the transistor 117*m*. The transistor 117*s* and the transistor 117*m* are controlled to be on or off.

The shorting circuit 137 connected between the gate terminals g and the emitter terminals e of the transistor 117*m* and the transistor 117*s* is switched off. The switch circuit 124*c* and the switch circuit 124*d* are switched off (open). A constant current Id flows between the P electrode terminal and the N electrode terminal in the semiconductor components 117.

By controlling the transistor 117*m* and the transistor 117*s* not to be switched on at the same time, or else by controlling the transistor 117*m* and the transistor 117*s* to be switched on for a short period of time, a surge-voltage, transient current flows in the semiconductor component 117, such that more severe testing may be conducted.

The semiconductor component 117 is tested by selecting or combining the timing waveforms of FIG. 19 and the tests of FIG. 26A to 26F. Examples of the combination include the case where the tests of FIG. 26A to 26F are carried out in order, and the case where the tests of FIG. 26A to 26F are randomly carried out.

FIGS. 27A and 27B are explanatory diagrams of a semiconductor-component test device and a semiconductor component testing method according to another embodiment of the present invention. FIG. 3A1 through 3E2 and elsewhere exemplarily illustrate test circuit modules 301. The test circuit modules 301 are connected to sections A, B, and C in FIG. 27A. The test circuit modules 301 are prepared corresponding to the respective semiconductor components 117. Examples of the test circuit module 301 are illustrated in FIG. 26A to 26F and FIG. 3A2 to 3E2. The test circuit modules 301 are connected to three switch circuit boards 201 (switch circuit board 201*b*, switch circuit board 201*c*, and switch circuit board 201*d*). As illustrated in FIG. 27A, the switch circuit board 201*b* is prepared corresponding to the semiconductor component 117 being tested. In FIG. 27A, a switch circuit 124*aa* is arranged on the test circuit module 301*a*, a switch circuit 124*ab* is arranged on the test circuit module 301*b*, and a switch circuit 124*ac* is arranged on the test circuit module 301*c*.

The example in FIG. 27A is an embodiment for testing a plurality of semiconductor components 117. Semiconductor-component test devices of the present invention can test a plurality of test circuit modules 301 simultaneously or sequentially by controlling the switch circuit 124*a*.

The test circuit modules 301 are controlled by a single control circuit board 111. One power supply 132 may be prepared for a plurality of test circuit modules 301 (semiconductor components 117) being tested.

FIG. 27B is a timing chart for explaining the operation of the semiconductor-component test device of the present invention. The on-voltage Vsg is sequentially applied to the transistors 117*m* of the test-circuit modules 301 to operate them and carry out testing.

It should be understood that the features as well as content described in the present specification and drawings can be combined with each other. The present invention affords semiconductor-component test devices and semiconductor testing methods allowing easy connection changes according to the testing particulars for transistors and like semiconductor components, and to the number of simultaneous tests of semiconductor components.

LEGEND

111: control circuit board (controller)
112: gate-signal control circuit 113: gate driver circuit
115: temperature measuring circuit
116: op amp/buffer amp (voltage output circuit)
117: power transistor
118: constant-current circuit
121: constant-current circuit
122: switch circuit
124: switch circuit
125: variable resistor circuit
126: variable resistor circuit
127: selector
128: current-detection circuit
129: voltage-detection circuit
130: constant-current setting circuit
131: control rack
132: power-source device
133: control circuit
134: heating/cooling plate
135: circulating water pipe
136: chiller
137: shorting circuit
138: isolated DC-to-DC converter circuit
201: switch circuit board
202: connector
203: sample connection circuit
204: conductor plate
205: fork plug
206: connection pin
207: mother board
208: connector
209: device-controlling circuit board
210: cabinet
201: connection lines
212: power-source lines
213: connector
214: partitioning wall
215: partitioning wall
216: opening
219: connection bolt
220: contact part
221: fixing screw
222: signal line
223: heat pipe
224: fixing screw
225: contact
226: component terminal
227: cooling fin
228: heat-radiating fin
231: heat pipe fixture
232: connection pressuring part
233: connection retaining part
236: spring (pressuring fixture)
237: position-fixing screw
238: threaded hole
239: spring hole
240: aligning screw hole
241: fork-plug insertion plate
251: protrusion
252: channel
301: test circuit module
302: voltage selection circuit
311: presser
312: insulating plate
313: presser mounting plate
315: insulating part

What is claimed is:

1. A semiconductor-device test apparatus for testing a semiconductor-device having a first connection, a second connection, and a gate connection, the semiconductor-device test apparatus equipped with:

a power-supply circuit having a third connection and a fourth connection, and for supplying either test current or test voltage;

a first switch-circuit board having a fifth connection and a sixth connection, and on which a first switch circuit is either disposed or formed;

a voltage output circuit for outputting a voltage across the first connection and the second connection of the semiconductor device under test; and a gate driver circuit for applying to the gate connection a periodic signal voltage; wherein said third connection and said sixth connection are connected;

said fifth connection is for connecting with the first connection; and said fourth connection is for connecting with the second connection.

2. The semiconductor-device test apparatus set forth in claim 1, wherein:

said first switch-circuit board has a first conductor plate/ conductor rod and a second conductor plate/conductor rod;

a first terminal of said first switch circuit of said first switch-circuit board is connected to said first conductor plate/conductor rod;

a second terminal of said first switch circuit of said first switch-circuit board is connected to said second conductor plate/conductor rod;

operation of said first switch circuit electrically short-circuits said first conductor plate/conductor rod and said second conductor plate/conductor rod; and the first connection of the semiconductor device under test connects either to said first conductor plate/conductor rod or to said second conductor plate/conductor rod.

3. The semiconductor-device test apparatus set forth in claim 1, wherein:

said gate driver circuit is further for outputting any one of a first voltage, a second voltage, or a third voltage;

the first voltage is a voltage that puts the semiconductor device under test into an on state;

the second voltage and the third voltage are voltages that put the semiconductor device under test into an off state;

the third voltage is of lower potential than the second voltage; and said gate driver circuit is further for applying the third voltage to the gate connection.

4. The semiconductor-device test apparatus set forth in claim 1, further equipped with a constant-current circuit for outputting a constant current; wherein:

a diode connects to the first connection and the second connection, and said constant-current circuit supplies the constant current to said diode;

the signal voltage that said gate driver circuit applies to the gate connection puts the semiconductor device under test into an off state; and said voltage output circuit outputs the inter-terminal voltage that is across said diode to which the constant current is applied.

5. The semiconductor-device test apparatus set forth in claim 1, further equipped with a heating/cooling plate, wherein:

the first connection and the second connection are disposed on a first side of the semiconductor device under test, and the gate connection is disposed in a position where it opposes the first side of the semiconductor device under test;

a first surface and a second surface of the semiconductor device under test make tight contact with said heating/cooling plate;

a water-leak sensor is disposed along the periphery of said heating/cooling plate; and operation of said water-leak sensor causes at least one of either an operation that halts the semiconductor-device test apparatus or an operation that sounds an alarm.

6. The semiconductor-device test apparatus set forth in claim 1, wherein:

a plurality of said first switch circuits are either disposed or formed on said first switch-circuit board;

said first switch circuits are MOSFETs; and said MOSFETs are controlled synchronized to the signal voltage that said gate driver circuit outputs.

7. The semiconductor-device test apparatus set forth in claim 1, wherein the voltage that said voltage output circuit outputs is converted into temperature information on the semiconductor device under test, and is controlled based on the temperature information.

8. A semiconductor-device test apparatus for testing a semiconductor device having a first connection, a second connection, and a gate connection, the semiconductor-device test apparatus equipped with:

a power-supply circuit having a third connection and a fourth connection, and for supplying either test current or test voltage;

a first switch-circuit board having a fifth connection and a sixth connection, and on which a first switch circuit is either disposed or formed;

a second switch-circuit board having a seventh connection and an eighth connection, and on which a second switch circuit is either disposed or formed;

a voltage output circuit for outputting a voltage across the first connection and the second connection of the semiconductor device under test; and a gate driver circuit for applying to the gate connection a periodic signal voltage; wherein said third connection and said sixth connection are connected;

said fifth connection is for connecting with the first connection;

said fourth connection is for connecting with the second connection;

said seventh connection and said third connection are connected; and said eighth connection and said fourth connection are connected.

9. The semiconductor-device test apparatus set forth in claim 8, wherein:

said first switch-circuit board has a first conductor plate/conductor rod and a second conductor plate/conductor rod;

a first terminal of said first switch circuit of said first switch-circuit board is connected to said first conductor plate/conductor rod;

a second terminal of said first switch circuit of said first switch-circuit board is connected to said second conductor plate/conductor rod;

operation of said first switch circuit electrically short-circuits said first conductor plate/conductor rod and said second conductor plate/conductor rod; and the first connection of the semiconductor device under test connects either to said first conductor plate/conductor rod or to said second conductor plate/conductor rod.

10. The semiconductor-device test apparatus set forth in claim 8, further equipped with:

a motherboard; and a partitioning wall separating a space for receiving the semiconductor device under test, from said first switch-circuit board and said second switch-circuit board; wherein said first switch-circuit board and said second switch-circuit board are connected to said motherboard via connectors; and disposed in said partitioning wall are openings, corresponding to positions of said first switch-circuit board and said second switch-circuit board, through which a first terminal of the semiconductor device under test connects to at least one switch circuit of either said first switch circuit of said first switch-circuit board, or said second switch circuit of said second switch-circuit board.

11. The semiconductor-device test apparatus set forth in claim 8, wherein:

said gate driver circuit is further for outputting any one of a first voltage, a second voltage, or a third voltage;

the first voltage is a voltage that puts the semiconductor device under test into an on state;

the second voltage and the third voltage are voltages that put the semiconductor device under test into an off state;

the third voltage is of lower potential than the second voltage;

said gate driver circuit is further for applying the third voltage to the gate connection; and said voltage output circuit outputs a voltage across the first connection and the second connection of the semiconductor device under test.

12. The semiconductor-device test apparatus set forth in claim 8, further equipped with a constant-current circuit for outputting a constant current, wherein:

a diode connects to the first connection and the second connection, and said constant-current circuit supplies the constant current to said diode;

the signal voltage that said gate driver circuit applies to the gate connection puts the semiconductor device under test into an off state; and said voltage output circuit outputs the inter-terminal voltage that is across said diode to which the constant current is applied.

13. The semiconductor-device test apparatus set forth in claim 8, further equipped with a connection plug, wherein:

said semiconductor-device test apparatus is housed in a cabinet sectioned into a first division and a second division located in a lower part of said first division;

in said second division, said first switch-circuit board is disposed;

said connection plug is for connecting to the first connection;

said connection plug is inserted through said first division into said second division; and said connection plug is connected with said fifth connection.

14. The semiconductor-device test apparatus set forth in claim 8, further equipped with a connecting member, wherein:

the first connection of the semiconductor device under test has a first surface and a second surface;

the connection member is for electrically connecting to the first surface, wherein via the connection member the first surface electrically connects to the first switch circuit; and the connection member is electrically insulated from the second surface.

15. The semiconductor-device test apparatus set forth in claim 8, wherein the voltage that said voltage output circuit outputs is converted into temperature information on the semiconductor device under test, and is controlled on the basis of the temperature information.

16. The semiconductor-device test apparatus set forth in claim 8, wherein:

when supplying of test current or test voltage to the semiconductor device under test is started, after a second period when the second switch circuit has been on, the first switch circuit is switched on, and after a first period when the first switch circuit has been on, the second switch circuit is switched off; and when supplying of test current or test voltage to the semiconductor device under test is stopped, after a third period when the second switch circuit has been on, the first switch circuit is switched off, and after a fourth period when the first switch circuit has been off, the second switch circuit is switched off.

17. A semiconductor-device test apparatus for testing a semiconductor device having a first connection, a second connection, a thirteenth connection, a first gate connection, and a second gate connection, equipped with:

a power-supply circuit having a third connection and a fourth connection, and for supplying either test current or test voltage;

a first switch-circuit board having a fifth connection and a sixth connection, and on which a first switch circuit is either disposed or formed;

a second switch-circuit board having a seventh connection and an eighth connection, and on which a second switch circuit is either disposed or formed;

a first gate driver circuit for applying a periodic first signal voltage to the first gate connection; and a second gate driver circuit for applying a periodic second signal voltage to the second gate connection; wherein said third connection and said sixth connection are connected;

said fifth connection is for connecting with the first connection;

said fourth connection is for connecting with the second connection;

said seventh connection and said third connection are connected; and said eighth connection and said fourth connection are connected.

18. The semiconductor-device test apparatus set forth in claim 17, further equipped with:

a third switch-circuit board having a ninth connection and a tenth connection; and a fourth switch-circuit board having an eleventh connection and a twelfth connection; wherein a third switch circuit is either disposed or formed on the third switch-circuit board;

a fourth switch circuit is either disposed or formed on the fourth switch-circuit board;

said ninth connection and said third connection are connected;

said tenth connection is for connecting with the thirteenth connection;

said tenth connection and said eleventh connection are connected; and said twelfth connection and said fourth connection are connected.

19. The semiconductor-device test apparatus set forth in claim 17, wherein:

said first gate driver circuit generates the first signal voltage with the thirteenth connection of the semiconductor device under test as a reference potential;

said second gate driver circuit generates the second signal voltage with the second connection of the semiconductor device under test as a reference potential; and the potential of the first signal voltage is floating with respect to the potential of the second signal voltage.

20. The semiconductor-device test apparatus set forth in claim 17, wherein:

said first switch-circuit board has a first conductor plate/conductor rod and a second conductor plate/conductor rod;

a first terminal of said first switch circuit of said first switch-circuit board is connected to said first conductor plate/conductor rod;

a second terminal of said first switch circuit of said first switch-circuit board is connected to said second conductor plate/conductor rod;

operation of said first switch circuit electrically short-circuits said first conductor plate/conductor rod and said second conductor plate/conductor rod; and the first connection of the semiconductor device under test connects either to said first conductor plate/conductor rod or to said second conductor plate/conductor rod.

21. The semiconductor-device test apparatus set forth in claim 17, further equipped with:

a motherboard; and a partition wall separating a space for receiving the semiconductor device under, from the first switch circuit board and the second switch circuit board; wherein the first switch circuit board and the second switch circuit board are connected to the mother board via connectors; and disposed in said partitioning wall are openings, corresponding to positions of said first switch-circuit board and said second switch-circuit board, through which a first terminal of the semiconductor device under test connects to at least one switch circuit of either said first switch circuit of said first switch-circuit board, or said second switch circuit of said second switch-circuit board.

22. The semiconductor-device test apparatus set forth in claim 17, wherein:

the gate driver circuit is further for outputting any one of a first voltage, a second voltage, or a third voltage;

the first voltage is a voltage that puts the semiconductor device under test into an on state;

the second voltage and the third voltage are voltages that put the semiconductor device under test into an off state; and the third voltage is of lower potential than the second voltage.

23. The semiconductor-device test apparatus set forth in claim 17, wherein:

said semiconductor-device test apparatus is housed in a cabinet sectioned into a third division and a second division, and the first switch-circuit board is disposed in the second division;

the semiconductor device under test is disposed in the third division; and said semiconductor-device test apparatus is enabled for injecting dry air into the third division.

24. The semiconductor-device test apparatus set forth in claim 17, wherein the voltage that said voltage output circuit outputs is converted into temperature information on the semiconductor device under test, and is controlled based on the temperature information.

25. The semiconductor-device test apparatus set forth in claim 17, wherein:

when supplying of test current or test voltage to a semi-conductor device is started, after a second period when the second switch circuit has been on, the first switch circuit is switched on, and after a first period when the first switch circuit has been on, the second switch circuit is switched off; and when supplying of test current or test voltage to the semiconductor device is stopped, after a third period when the second switch circuit has been on, the first switch circuit is switched off, and after a fourth period when the first switch circuit has been off, the second switch circuit is switched off.

26. A semiconductor-device test apparatus for testing a semiconductor device having a first connection, a second connection, and a gate connection, the semiconductor-de-vice test apparatus equipped with:

a power-supply circuit having a third connection and a fourth connection, and for supplying either test current or test voltage;

a first switch-circuit board having a fifth connection and a sixth connection, and on which a first switch circuit is either disposed or formed;

a gate driver circuit for applying to the gate connection a periodic signal voltage; and a resistor circuit either formed or arranged on the gate connection of the semiconductor device under test and on the gate driver circuit; wherein said third connection and said sixth connection are con-nected;

said fifth connection is for connecting with the first connection;

said fourth connection is for connecting with the second connection; and voltage across the resistor-circuit terminals is measured.

27. The semiconductor-device test apparatus set forth in claim 26, wherein:

said first switch-circuit board has a first conductor plate/ conductor rod and a second conductor plate/conductor rod;

a first terminal of said first switch circuit of said first switch-circuit board is connected to said first conductor plate/conductor rod;

a second terminal of said first switch circuit of said first switch-circuit board is connected to said second con-ductor plate/conductor rod;

operation of said first switch circuit electrically short-circuits said first conductor plate/conductor rod and said second conductor plate/conductor rod; and the first connection of the semiconductor device under test connects either to said first conductor plate/conductor rod or to said second conductor plate/conductor rod.

28. The semiconductor-device test apparatus set forth in claim 26, wherein:

said gate driver circuit is further for outputting any one of a first voltage, a second voltage, or a third voltage;

the first voltage is a voltage that puts the semiconductor device under test into an on state;

the second voltage and the third voltage are voltages that put the semiconductor device under test into an off state; and the third voltage is of lower potential than the second voltage.

29. The semiconductor-device test apparatus set forth in claim 26, further equipped with a connecting member, wherein:

the first connection connects with said connecting mem-ber;

a recess is formed in said connecting member;

a heat pipe is disposed in the recess; and the linear expansion coefficient of said connecting mem-ber in its recess is smaller than the linear expansion coefficient of said heat pipe.

30. The semiconductor-device test apparatus set forth in claim 26, wherein the voltage that said voltage output circuit outputs is converted into temperature information on the semiconductor device under test, and is controlled based on the temperature information.

* * * * *